United States Patent
Gossner et al.

(10) Patent No.: US 8,405,121 B2
(45) Date of Patent: Mar. 26, 2013

(54) SEMICONDUCTOR DEVICES

(75) Inventors: Harald Gossner, Riemerling (DE); Ramgopal Rao, Mumbai (IN); Angada Sachid, Mumbai (IN); Ashish Pal, Mumbai (IN); Ram Asra, Mumbai (IN)

(73) Assignee: Infineon Technologies AG, Neubiberg (DE)

( * ) Notice: Subject to any disclaimer, the term of this patent is extended or adjusted under 35 U.S.C. 154(b) by 526 days.

(21) Appl. No.: 12/369,821

(22) Filed: Feb. 12, 2009

(65) Prior Publication Data

US 2010/0200916 A1    Aug. 12, 2010

(51) Int. Cl.
    H01L 29/66    (2006.01)
(52) U.S. Cl. .............. 257/104; 257/105; 257/E29.042
(58) Field of Classification Search .......... 257/9, 24–30, 257/192, 295–310, 328–347, E29.192, E21.395, 257/E21.399, 104, 105, 106, E29.042, E29.304
    See application file for complete search history.

(56) References Cited

U.S. PATENT DOCUMENTS

| | | | |
|---|---|---|---|
| 4,675,711 A | 6/1987 | Harder et al. | |
| 6,900,101 B2 | 5/2005 | Lin | |
| 7,834,345 B2 * | 11/2010 | Bhuwalka et al. | 257/28 |
| 7,839,209 B2 * | 11/2010 | Curatola et al. | 327/566 |
| 2006/0118776 A1 | 6/2006 | Tezuka et al. | |
| 2006/0258072 A1 | 11/2006 | Kavalieros et al. | |
| 2007/0178650 A1 | 8/2007 | Chen et al. | |
| 2007/0246773 A1 | 10/2007 | Pendharkar | |
| 2007/0278557 A1 * | 12/2007 | Chen et al. | 257/315 |
| 2008/0050881 A1 | 2/2008 | Chen et al. | |
| 2008/0200001 A1 | 8/2008 | Clavelier et al. | |
| 2008/0268588 A1 * | 10/2008 | Anderson et al. | 438/218 |
| 2009/0026553 A1 * | 1/2009 | Bhuwalka et al. | 257/402 |
| 2009/0101975 A1 | 4/2009 | Holz et al. | |
| 2009/0236657 A1 * | 9/2009 | Ananthan | 257/330 |
| 2010/0038713 A1 * | 2/2010 | Majhi et al. | 257/344 |

FOREIGN PATENT DOCUMENTS

| | | |
|---|---|---|
| DE | 102005007822 A1 | 8/2006 |
| WO | 2006087044 A1 | 8/2006 |
| WO | 2007124413 A2 | 11/2007 |

OTHER PUBLICATIONS

W. M. Reddick et al., "Silicon surface tunnel transistor", Applied Physics Letters, vol. 67, No. 4, pp. 494-496, 1995.
W. Hansch et al., "A Vertical MOS-Gated Esaki Tunneling Transistor in Silicon", Thin Solid Films, vol. 369, pp. 387-389, 2000.

(Continued)

Primary Examiner — Cuong Q Nguyen
Assistant Examiner — Yosef Gebreyesus

(57) ABSTRACT

In an embodiment, a semiconductor device is provided. The semiconductor device may include a substrate having a main processing surface, a first source/drain region comprising a first material of a first conductivity type, a second source/drain region comprising a second material of a second conductivity type, wherein the second conductivity type is different from the first conductivity type, a body region electrically coupled between the first source/drain region and the second source/drain region, wherein the body region extends deeper into the substrate than the first source/drain region in a first direction that is perpendicular to the main processing surface of the substrate, a gate dielectric disposed over the body region, and a gate region disposed over the gate dielectric, wherein the gate region overlaps with at least a part of the first source/drain region and with a part of the body region in the first direction.

27 Claims, 18 Drawing Sheets

OTHER PUBLICATIONS

K. K. Bhuwalka et al., "Performance Enhancement of Vertical Tunnel Field-Effect Transistor with SiGe in the Delta p+ Layer", Japanese Journal of Applied Physics, vol. 43, No. 7A, pp. 4073-4078, 2004.

A. Heigl et al., "Optimization of Vertical Tunneling Field-Effect Transistors", in Proc. of ULIS, 2007, pp. 133-136.

T. Nirschl et al., "The Tunneling Field Effect Transistor (TFET): the Temperature Dependence, the Simulation Model, and its Application", in Proc. of ISCAS, vol. 3, 2004, pp. 713-716.

M. Fulde et al., "Fabrication, Optimization and Application of Complementary Multiple-Gate Tunneling FETs", Proc. IEEE International Nanoelectronics Conference (INEC), Shanghai, 2008, pp. 579-584.

Vishwanath Nikam et al., "Optimization of n-channel tunnel FET for the sub-22nm gate length regime", 66th Device Research Conference Digest, Jun. 2008, pp. 77-78.

K. Gopalakrishnan et al., "I-MOS: A Novel Semiconductor Device with a Subthreshold Slope lower than kT/q", in IEDM Tech. Dig, 2002, pp. 289-292.

Naveen Verma et al., "A 65nm 8T Sub-V, SRAM Employing Sense-Amplifier Redundancy", Proc. ISSCC 2007, San Francisco, pp. 328-329.

* cited by examiner

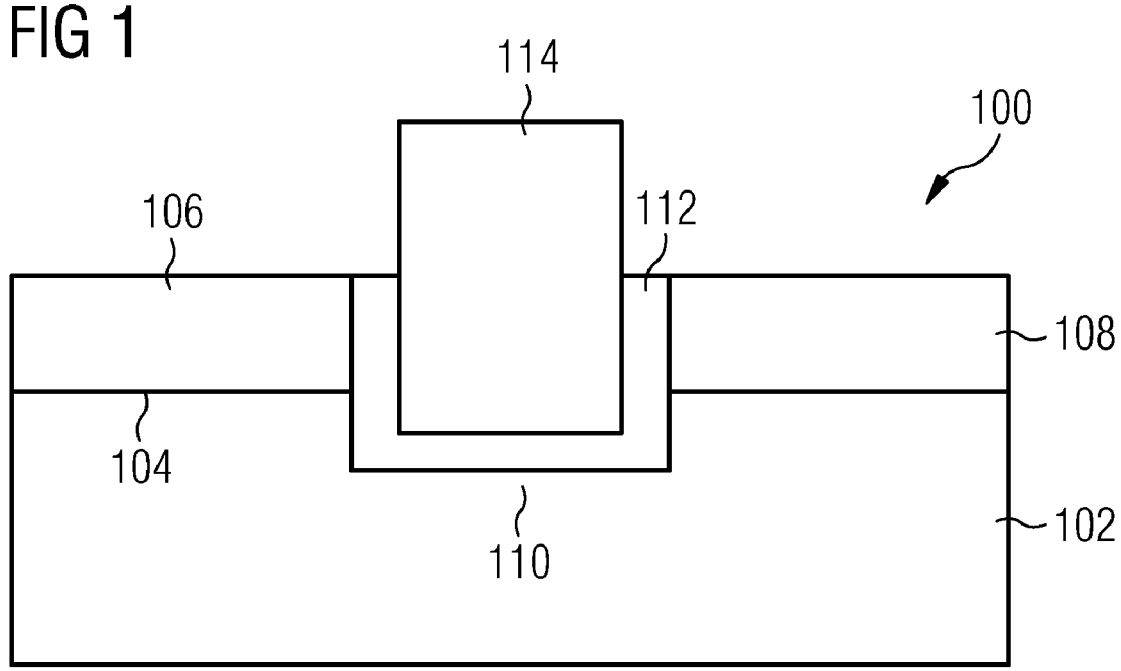
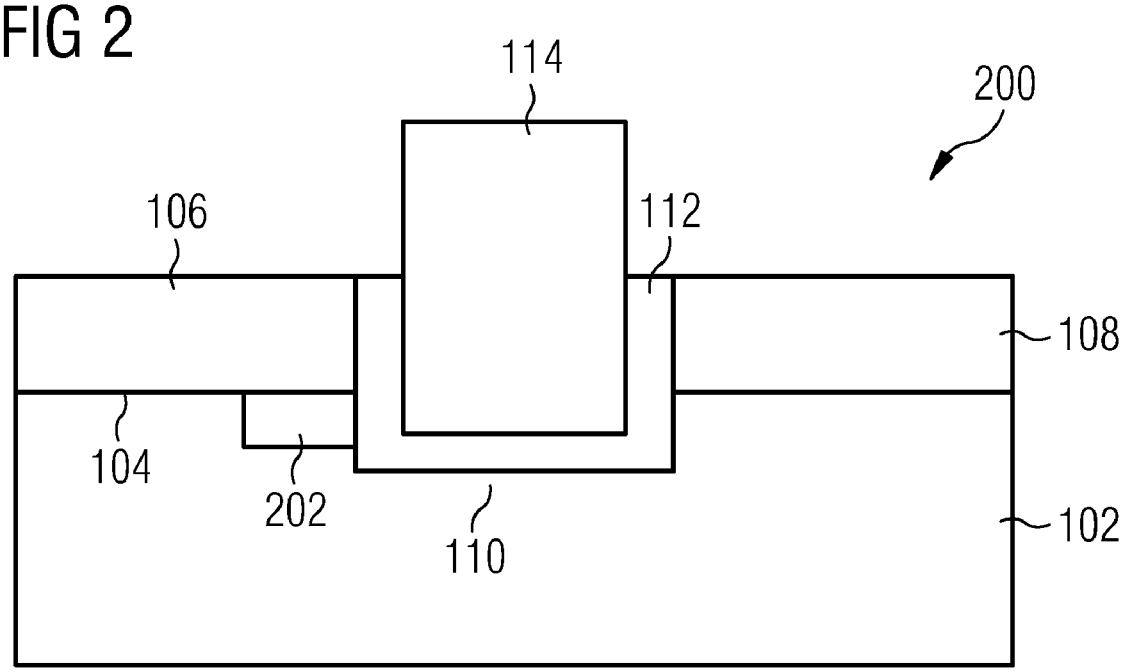

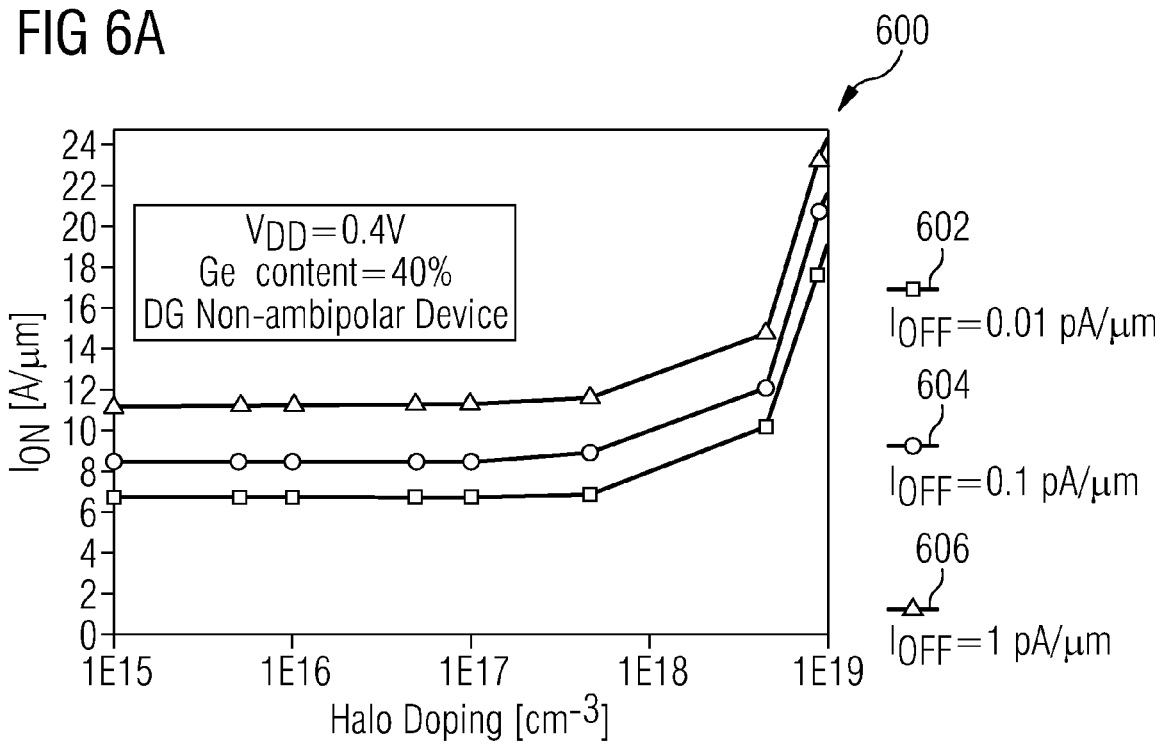
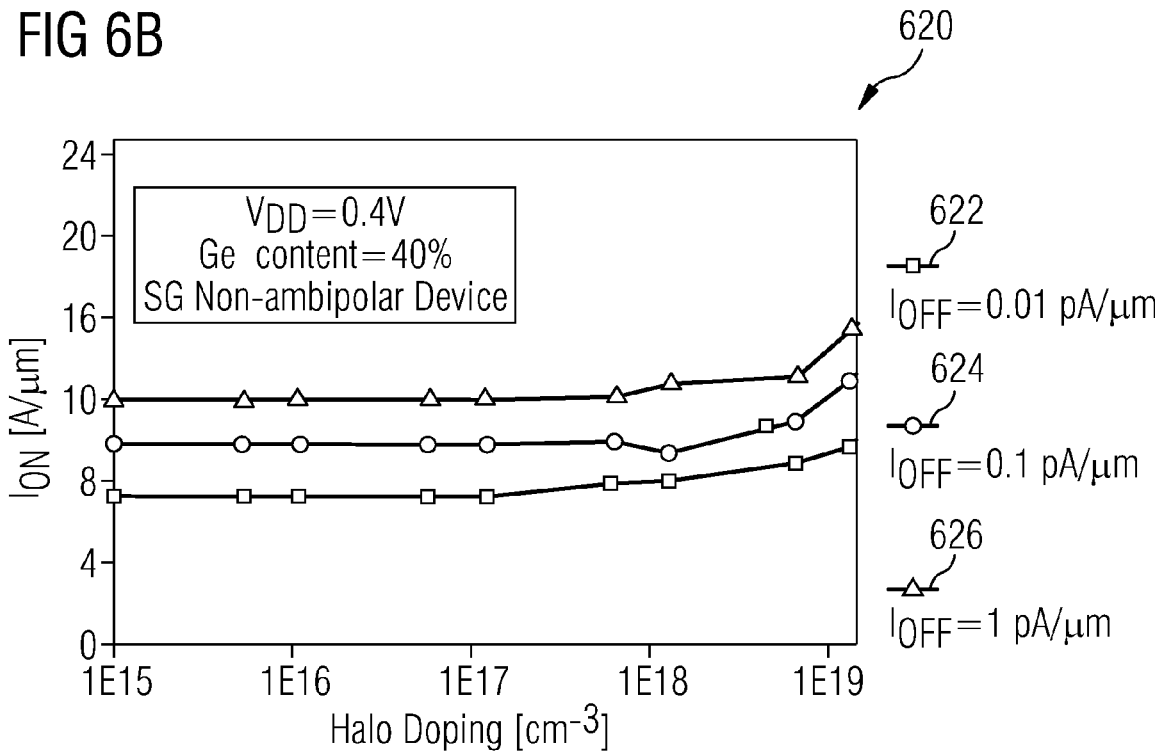

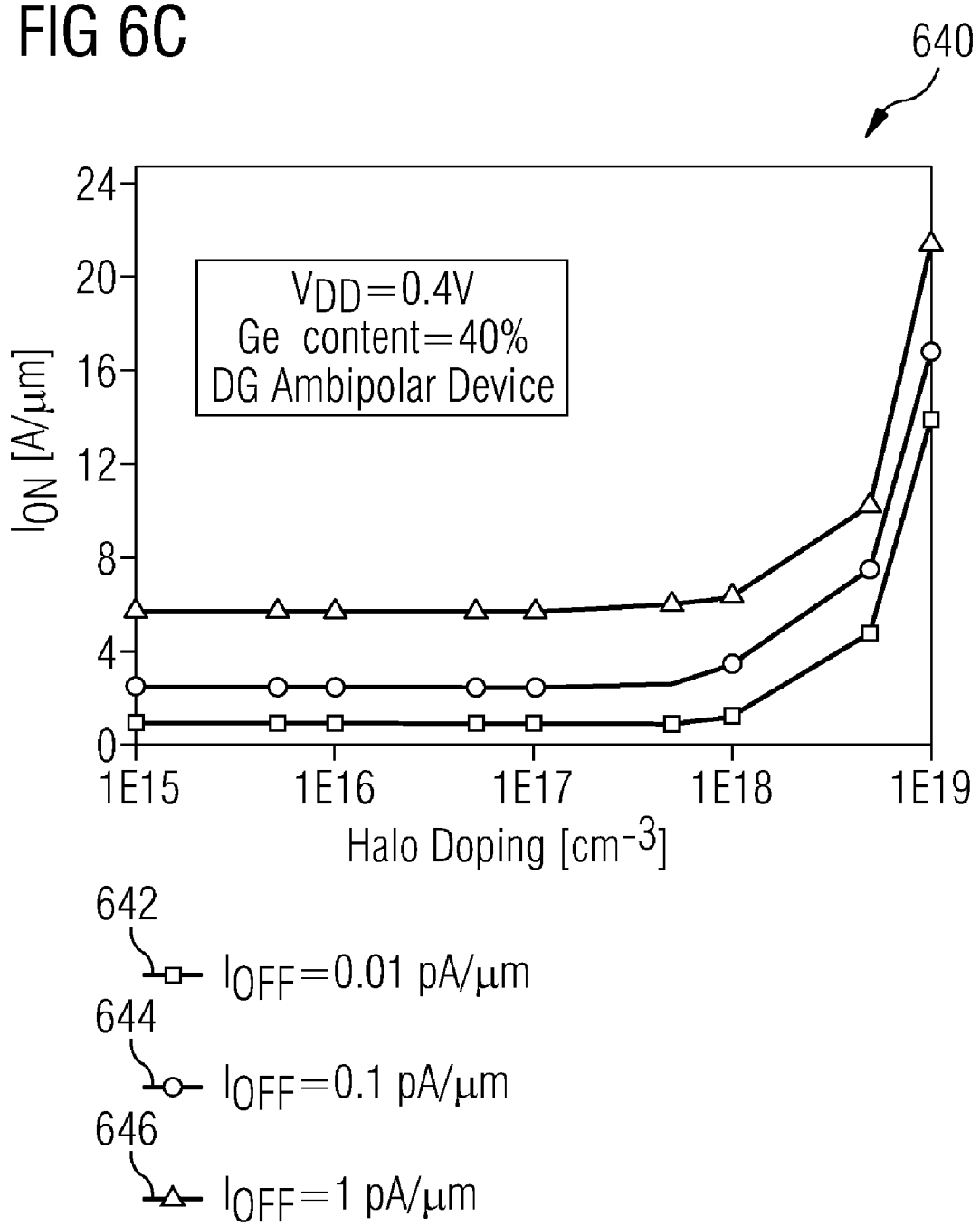

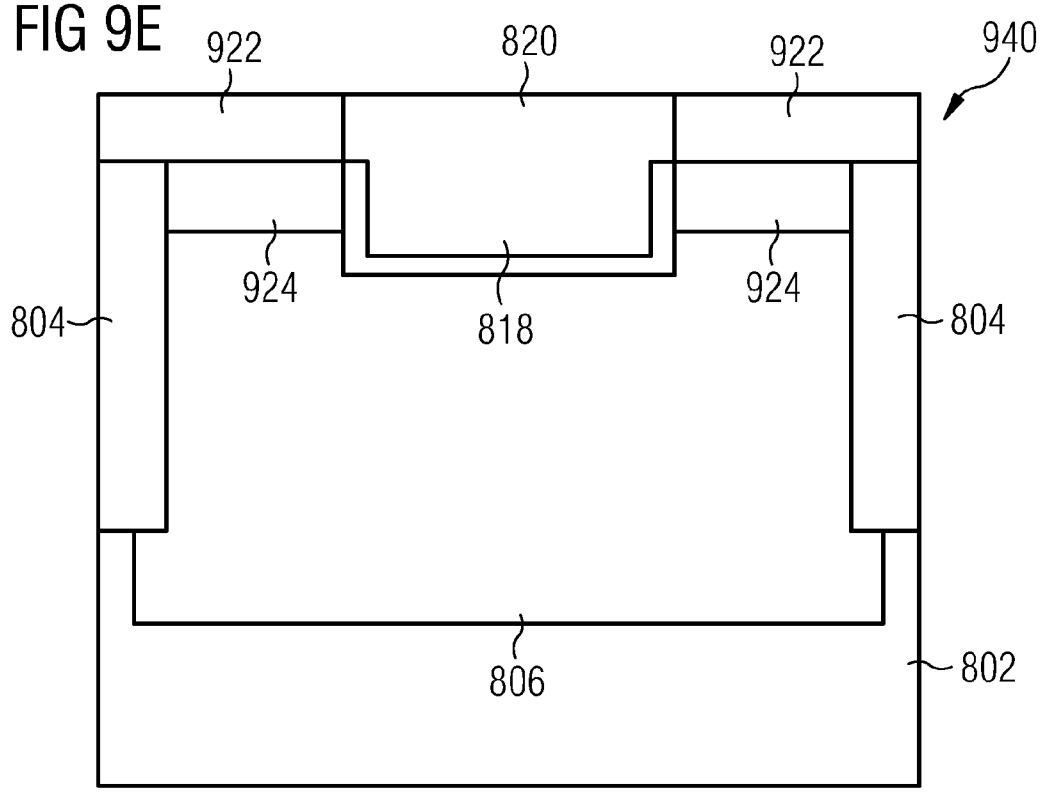
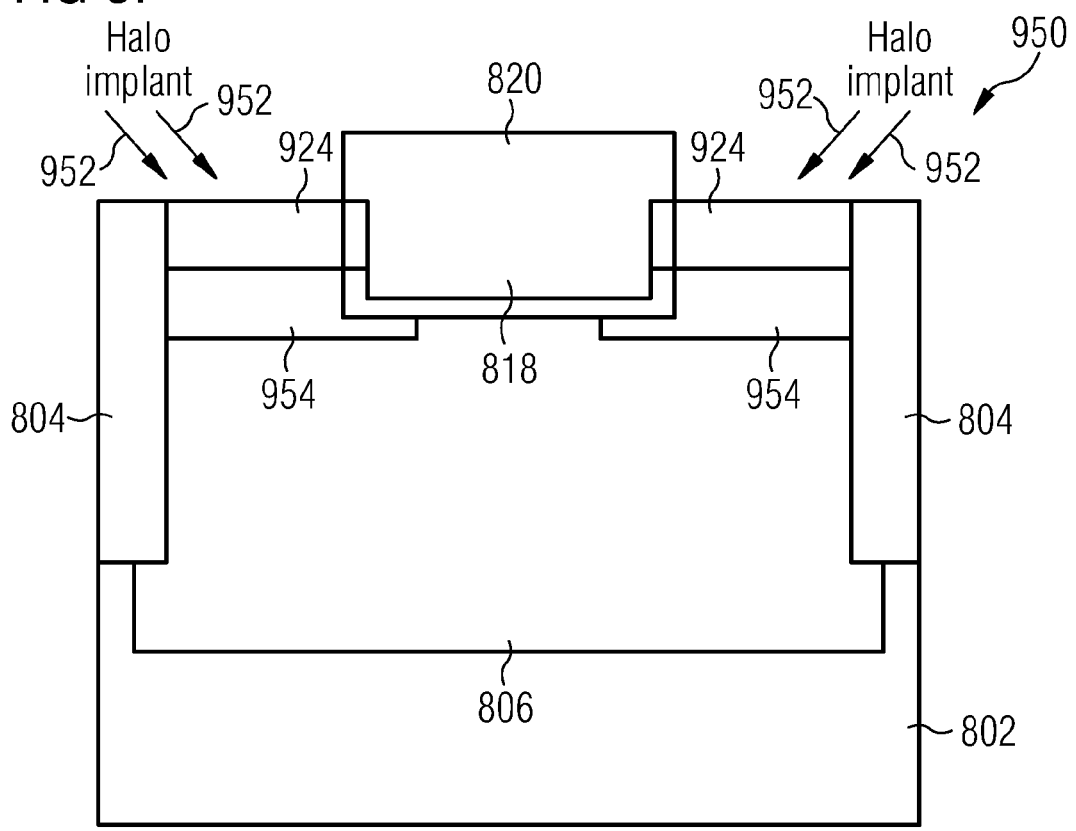

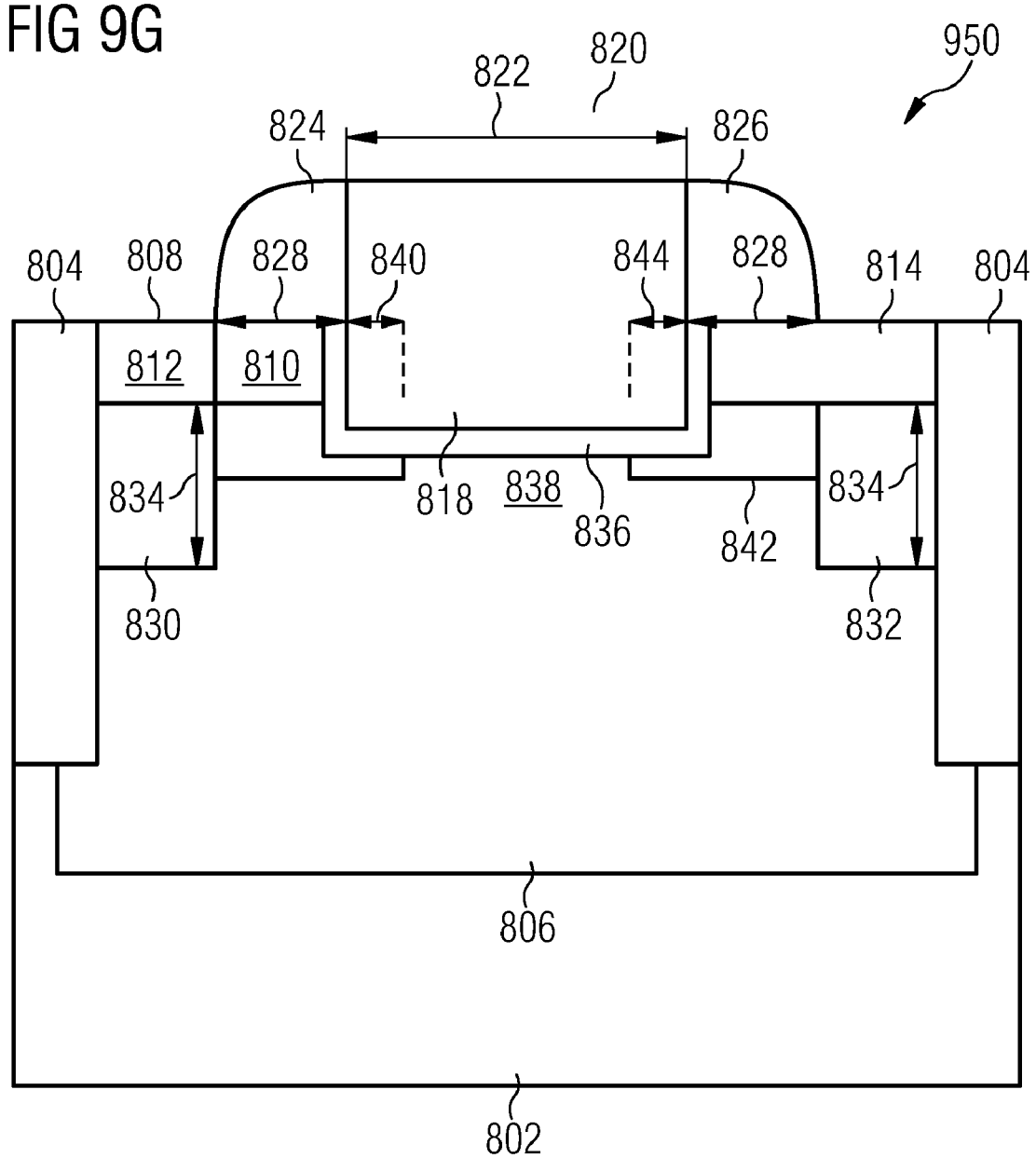

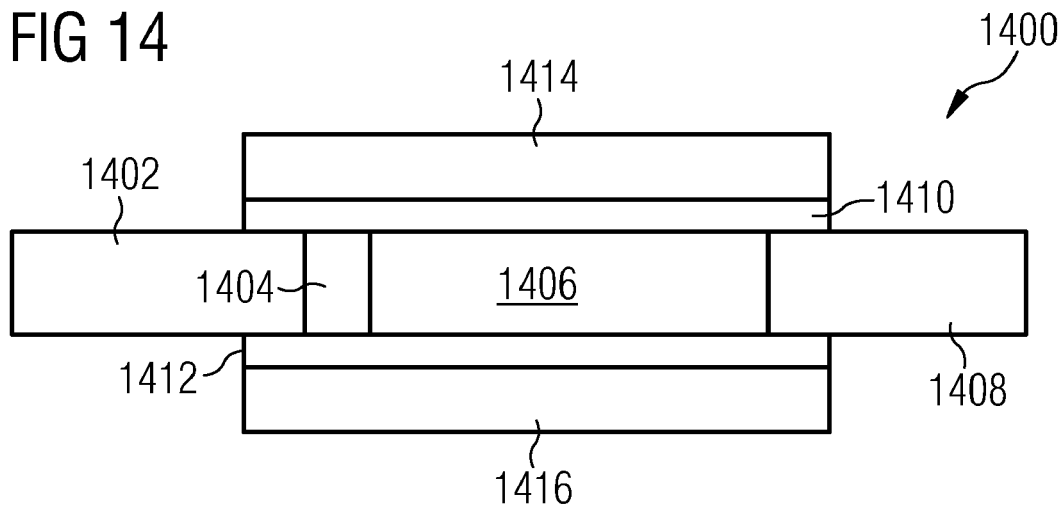
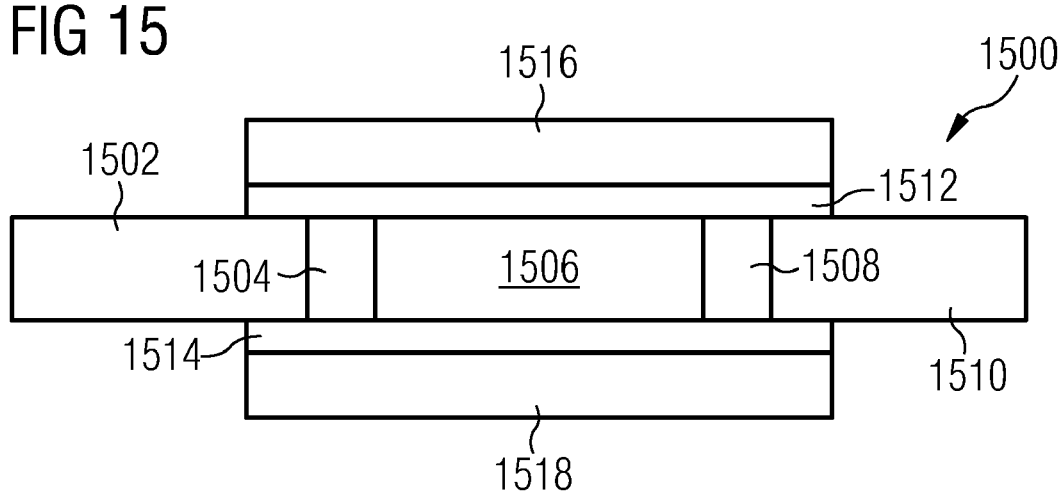
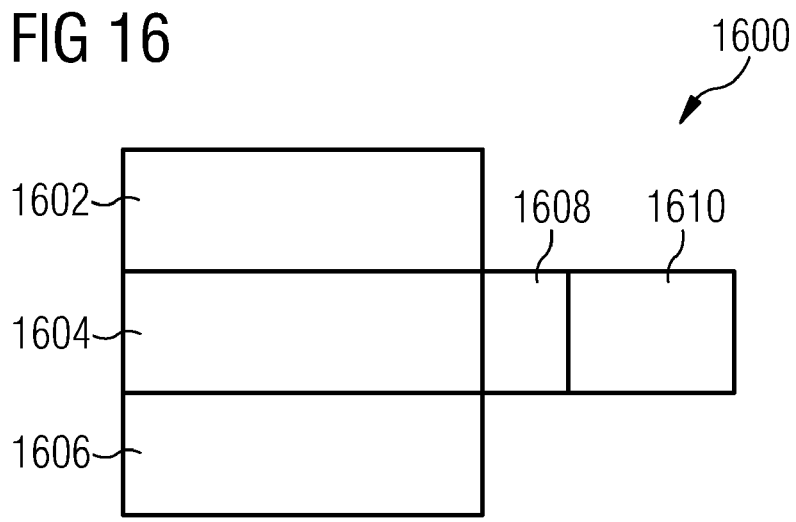

US 8,405,121 B2

SEMICONDUCTOR DEVICES

TECHNICAL FIELD

Various embodiments relate generally to semiconductor devices.

BACKGROUND

Downscating of integrated circuits (ICs) and miniaturization of mobile systems are hindered by the saturation in the reduction of the supply voltage $V_{DD}$ and signal voltage around 1 Volt (V). This is due to the requirement that on-current ($I_{on}$) to off-current ($I_{off}$) ratio usually needs to exceed a ratio of about $10^7$ to guarantee low current and power consumption providing long stand-by times and low heating of the ICs. The sub-threshold swing governing the transition from the off-state to the on-state should be in the range of about 63 mV/decade. This is a physical limitation for the conventional semiconductor devices in use for current ICs. At the same time, it is desired that the on-state is delivering several 100 µA/µm, ideally more than 500 µA/µm for NFET (N-channel field effect transistor) devices to be compliant with performance requirements of various electronic systems. Thus, for these applications, it is no solution to operate in the close to or even below threshold regime. It is desired to provide semiconductor devices which exhibit significantly lower sub-threshold swings (e.g. in the range from about 10 mV/decade to about 15 mV/decade) and provide a high on-current. It is desired to scale the supply voltage to values as low as about 0.3 V to about 0.4 V without loss of performance. This would lower the active power consumption (which is proportional to the product of the capacity and the square of the operating voltage) compared to an integrated circuit operating at a voltage of 1 V by almost an order of magnitude.

One conventional type of transistor for this purpose is the so-called Tunnel Field Effect Transistor (TFET). The concept of a TFET is usually based on a pin diode in reverse polarity, wherein the i-region is controlled by a gate. If the inversion channel is formed at the surface of the i-region, the energy band edges are bent in such a way that rather strong band-to-band tunneling occurs. The tunneling mechanism is usually not governed by $$\frac{eV}{kT}.$$

Thus, sub-threshold swings much below the 63 mV/decade may be achieved. In one conventional TFET, a sub-threshold swing as low as 10 mV/decade has been achieved. However, this conventional TFET is usually not used in standard CMOS (Complementary Metal Oxide Semiconductor) circuits due to its very low on-current at the desired voltage. This holds true for all conventional TFETs which may have different structures such as a lateral TFET, a vertical TFET, or a FIN-TFET. Typical values of a silicon based TFET is in the range from several 10 nA/µm to about 100 nA/µm.

An improvement of two to three orders of magnitude was achieved by the use of silicon germanium (SiGe) in the source region of a TFET. This conventional so-called HT-FET can achieve several 1 µA/µm to 10 µA/µm at an operating voltage $V_{DD}$ of about 0.4 V. The HT-FET has also proven good gate length scaling behavior. However, even for the HT-FET, the on-current is still too low for the ultra low voltage operation systems working at several 10 MHz to 100 MHz of operational frequency which requires an on-current of about several 100 µA/µm at an operating voltage $V_{DD}$ of about 0.4 V.

Another conventional device showing a low sub-threshold swing is the so-called IMOS (Impact Ionization Metal Oxide Semiconductor) device, which is based on driving the device into the avalanche multiplication regime. However, this typically requires a high source-to-drain-voltage beyond 1 V, even if the gate voltage ($V_G$) can be low. This does not comply to the request of a maximum $V_G=V_D$ (drain voltage)=$V_{DD}$ of being in the range from 0.3 V to 0.4 V.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a semiconductor device in accordance with an embodiment;

FIG. 2 shows a semiconductor device in accordance with another embodiment;

FIGS. 6A to 6C show diagrams illustrating the dependence of increase of the on-current of a TFET device on halo doping for various TFET device variants;

FIGS. 9A to 9G show a process flow for manufacturing the lateral TFET semiconductor device of FIG. 8;

FIG. 14 shows a top view of a non-ambipolar n type TFET semiconductor device with halo doping in accordance with an embodiment;

FIG. 15 shows a top view of an ambipolar n type TFET semiconductor device with halo doping in accordance with an embodiment;

FIG. 16 shows a semiconductor device in accordance with yet another embodiment;

DESCRIPTION

Figure 3:
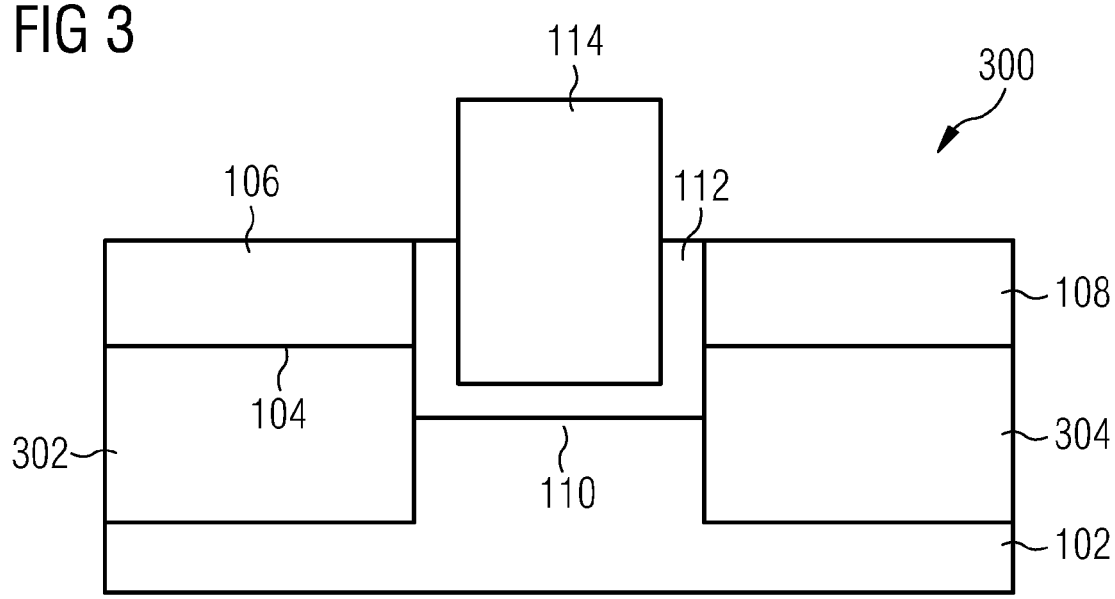
FIG. 3 shows a semiconductor device in accordance with yet another embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Although various embodiments which will be described in the following in more detail are based on a Tunnel Field Effect Transistor (TFET), it is to be noted that the embodiments are not limited thereto.

The concept of a TFET is usually based on a pin diode in reverse polarity, wherein the i-region (which may be formed by the body region in various embodiments) is controlled by a gate region.

FIG. 1 shows a semiconductor device 100 in accordance with an embodiment. In an embodiment, the semiconductor device 100 is configured as a TFET and may include a substrate 102 having a main processing surface 104. The semiconductor device 100 may further include a first source/drain region 106 (e.g. a source region 106) including a first material of a first conductivity type and a second source/drain region 108 (e.g. a drain region 108) including a second material of a second conductivity type, wherein the second conductivity type is different from the first conductivity type. The first source/drain region 106 and the second source/drain region 108 may be formed in or above the substrate 102. In various embodiments, the second source/drain region 108 may be laterally disposed from the first source/drain region 106. Furthermore, a body region 110 may be electrically coupled between the first source/drain region 106 and the second source/drain region 108. In some embodiments, the body region 110 may extend deeper into the substrate 102 than the first source/drain region 106 (and optionally also than the second source/drain region 108) in a first direction that is perpendicular to the main processing surface 104 of the substrate 102. A gate dielectric 112, e.g. implemented as a gate dielectric layer 112, may be disposed over the body region 110, and a gate region 114 may be disposed over the gate dielectric 112. By way of example, the body region 110 may extend deeper into the substrate 102 than the first source/drain region 106 near the gate region 114. In various embodiments, the first source/drain region 106 (e.g. the source region 106) and the second source/drain region 108 (e.g. the drain region 108) may be arranged laterally adjacent to the gate region 114.

It should be noted that the term the body region 110 extends deeper into the substrate 102 than the first source/drain region 106 (and optionally also than the second source/drain region 108) in a first direction that is perpendicular to the main processing surface 104 of the substrate 102 is e.g. to be understood such that at least one vector component of the extension direction e.g. of the sidewalls of the gate region 114 extending into the substrate 102 is defined by the first direction, in other words, e.g. the sidewalls of the gate region 114 does not need to be necessarily perpendicular to the main processing surface of the substrate 102 but could also be inclined to it. By way of example, the direction, in which the gate region 114 enters into the substrate 102, relative to the main processing surface of the substrate 102 may be selected in such a way that the mass of the charge carriers is reduced, e.g. minimized. This may be achieved e.g. by selecting the direction, in which the gate region 114 enters into the substrate 102, relative to the main processing surface of the substrate 102 may be selected dependent on the substrate 102 orientation and/or the orientation of the gate (in other words, e.g. the orientation of the sidewalls of the gate region 114) relative to the crystal axes of the substrate 102.

The body region 110 may be understood as being a region which may be rendered electrically conductive (in other words form a conductive channel) in response to an appropriate voltage application to the gate region 114 and to the first source/drain region 106 and the second source/drain region 108.

The gate region 114 may overlap with at least a part of the first source/drain region 106 and with a part of the body region 110 in the first direction, in other words, in a direction that is perpendicular to the main processing surface of the substrate 102.

Clearly, the semiconductor device 100 in accordance with various embodiments may be understood as a planar semiconductor device 100, e.g. a planar TFET device with an at least partial "vertical" overlapping of the gate region 114 with the first source/drain region 106, e.g. the source region 106, and the body region 110.

In various embodiments, the first material of the first conductivity type may include semiconductor material, e.g. silicon. In various embodiments, the first material of the first conductivity type may include semiconductor compound material. In various embodiments, the first material of the first conductivity type may include semiconductor compound material under strain, e.g. under physical strain. The additional strain may allow to additionally modify the energy band gap. By way of example, the first material of the first conductivity type may include one or more of the following materials:

IV-IV semiconductor compound material such as e.g. SiGe (e.g. for an n-channel TFET) or SiC (e.g. for a p-channel TFET);

III-V semiconductor compound material such as e.g. GaAs or InP;

II-VI semiconductor compound material such as e.g. AlGaAs;

a ternary semiconductor compound material; and a quaternary semiconductor compound material.

In various alternative embodiments, the first material of the first conductivity type may include one or more metals such as e.g. a silicide.

In various alternative embodiments, the body region 110 may include or consist of silicon or silicon germanium. In alternative embodiments, the substrate (e.g. a wafer substrate) 102 including the body region 110 may be made of a semiconductor material of various types, including silicon, germanium, Group III to V or other types, including polymers, for example, although in another embodiment other suitable materials can also be used. In an embodiment, the substrate 102 may be made of silicon (doped or undoped), in an alternative embodiment, the substrate 102 may be a silicon on insulator (SOI) substrate. As an alternative, any other suitable semiconductor material may be used for the substrate 102, for example semiconductor compound material such as gallium arsenide (GaAs), indium phosphide (InP), but also any suitable ternary semiconductor compound material or quaternary semiconductor compound material such as indium gallium arsenide (InGaAs).

In various embodiments, the first material of the first conductivity type may include semiconductor material having a different energy band gap than the material of the body region 110. By way of example, the first material of the first conductivity type may include semiconductor material having a smaller energy band gap than the material of the body region 110 (in case of an n-channel TFET, for example). Alternatively, the first material of the first conductivity type may include semiconductor material having a larger energy band gap than the material of the body region 110 (in case of a p-channel TFET, for example).

FIG. 2 shows a semiconductor device 200 in accordance with another embodiment. The semiconductor device 200 shown in FIG. 2 is similar to the semiconductor device 100 shown in FIG. 1 and in some embodiments, a portion of the body region 110 may be a tunneling region 202 electrically coupled between the first source/drain region 106 and the remaining portion of the body region 110. In another embodiment, the tunneling region 202 may be disposed only or in addition below the first source/drain region 106.

In various embodiments, the tunneling region 202 may include or may be made of different material than the first material of the first conductivity type provided for the first source/drain region 106.

Alternatively, in various embodiments, the tunneling region 202 may include or may be made of the same material as the first material of the first conductivity type provided for the first source/drain region 106. In these embodiments, the material of the tunneling region may have a different concentration of doping atoms than the first material of the first conductivity type in the first source/drain region 106. By way of example, the material provided for the first source/drain region 106 and for the tunneling region 202 may be SiGe, wherein the concentration of germanium in the silicon germanium in the tunneling region 202 may be lower than the concentration of germanium in the silicon germanium in the first source/drain region 106. Alternatively or in addition, further doping atoms (in case the first conductivity type is a p conductivity type, in other words, in case the first source/drain region 106 is highly p doped ($p^+$-doped) e.g. with p-type doping atoms such as e.g. boron (B), or in case the first conductivity type is an n conductivity type, in other words, in case the first source/drain region 106 is highly n doped ($n^+$-doped) e.g. with n-type doping atoms such as e.g. phosphorous (P) or arsenic (As)) may be provided in the first source/drain region 106 and/or the tunneling region 202. In this case, the concentration of the further doping atoms may be different in the tunneling region 202 as compared with the first source/drain region 106.

In yet other embodiments, the tunneling region 202 may include or may be made of material including doping atoms of the second conductivity type. In other words, the tunneling region 202 may illustratively be considered to be counter-doped compared with the first source/drain region 106. In various embodiments, the tunneling region 202 may include or be configured as a halo doping region 202 including doping atoms of the second conductivity type (in an alternative embodiment, the halo doping region 202 may include doping atoms of the first conductivity type).

In various embodiments, the material of the tunneling region 202 may include semiconductor material having a different energy band gap than the material of the body region 110. By way of example, the material of the tunneling region 202 may include semiconductor material having a smaller energy band gap than the material of the body region 110 (in case of an n-channel TFET, for example). In alternative embodiments, the material of the tunneling region 202 may include semiconductor material having a larger energy band gap than the material of the body region 110 (in case of a p-channel TFET, for example).

FIG. 3 shows a semiconductor device 300 in accordance with yet another embodiment. The semiconductor device 300 shown in FIG. 3 is similar to the semiconductor device 100 shown in FIG. 1 and may further include (although not shown in FIG. 3) the additional features of the semiconductor device 200 shown in FIG. 2 as described above. The semiconductor device 300 shown in FIG. 3 may further include a first well region 302 of the first conductivity type (i.e. the first well region 302 may be doped with doping atoms of the first conductivity type with a well doping concentration). The first source/drain region 106 may be disposed in the first well region 302. The semiconductor device 300 may further include a second well region 304 of the second conductivity type (i.e. the second well region 304 may be doped with doping atoms of the second conductivity type with a well doping concentration). The second source/drain region 108 may be disposed in the second well region 304.

Figure 4:
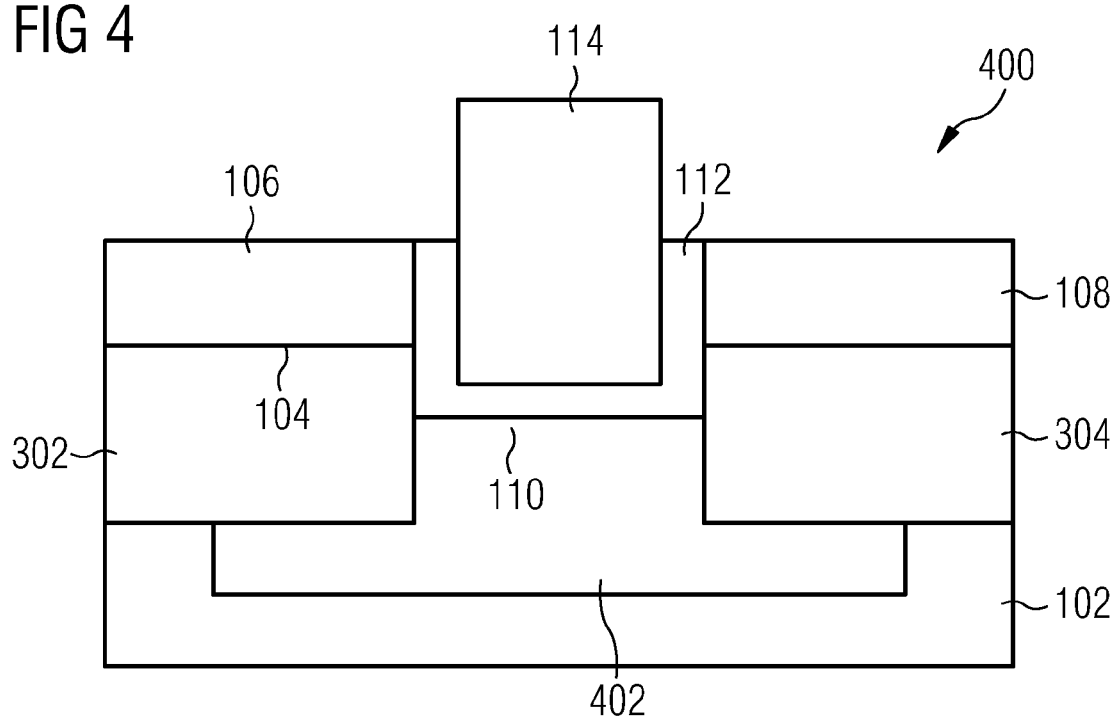
FIG. 4 shows a semiconductor device in accordance with yet another embodiment.

FIG. 4 shows a semiconductor device 400 in accordance with yet another embodiment. The semiconductor device 400 shown in FIG. 4 is similar to the semiconductor device 300 shown in FIG. 3 and may further include a third well region 402 of the second conductivity type (i.e. the third well region 402 may be doped with doping atoms of the second conductivity type with a well doping concentration). The first well region 302 and the second well region 304 may partially or completely be arranged in the third well region 402. Furthermore, the body region 110 may be arranged in the third well region 402.

Illustratively, in various embodiments, the energy band structure for example in the junction region (in other words interface region) between the first source/drain region 106 (e.g. the source region 106) and the body region 10 may be tailored in such a way that the tunneling barrier may significantly be reduced without degrading the off-current ($I_{off}$) in a relevant manner. In various embodiments, one or two of the following modifications compared with a conventional TFET device may be provided to achieve this.

As a first modification, narrow energy band gap material such as e.g. SiGe may be introduced into the first source/drain region, e.g. the source region (such as e.g. source/drain region 106, e.g. the source region 106). This may lead to a step in the energy band structure and may reduce the thickness of the tunneling barrier as illustrated in FIGS. 5A and 5B.

Figure 5A:
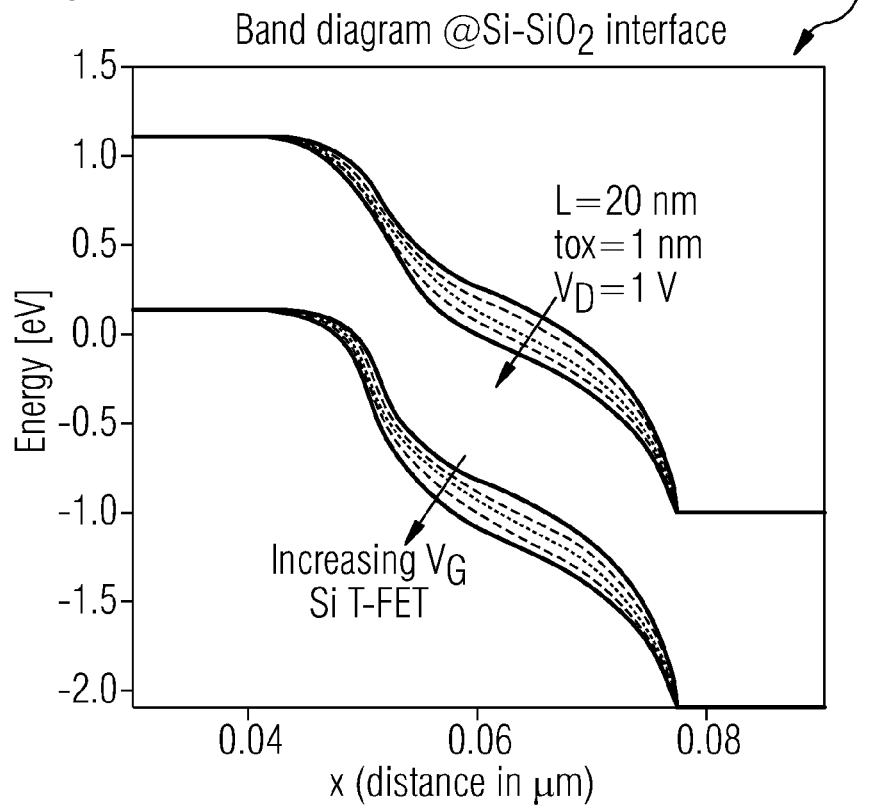
FIGS. 5A and 5B show diagrams illustrating the energy band diagram for a silicon TFET (FIG. 5A) and a HT-FET (FIG. 5B)
Figure 5B:
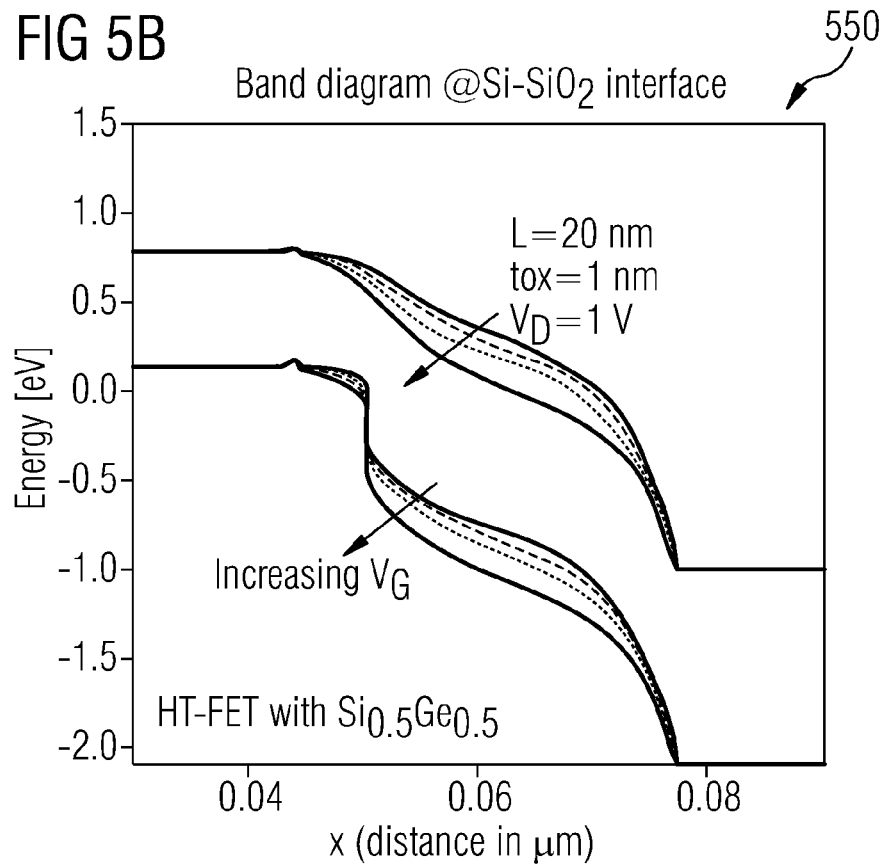

FIGS. 5A and 5B show diagrams illustrating the energy band characteristics for a silicon TFET in FIG. 5A (in a first energy band diagram 500) and a HT-FET in FIG. 5B (in a second energy band diagram 550) in an example having silicon oxide as material for the gate dielectric. In this example, the HT-FET examined included $Si_{0.5}Ge_{0.5}$ as material of the body region. Furthermore, the silicon TFET as well as the HT-FET in this example both had a gate length L of 20 nm and a layer thickness $t_{ox}$ of the gate dielectric layer of 1 nm and for both devices, a drain voltage $V_D$ of 1 V has been applied to the respective drain region.

As a second modification, to further push the tunneling rates into the desired regime, the tunneling barrier thickness may further be reduced by placing an abrupt pn-junction (in an n-channel TFET, for example) or np-junction (in a p-channel TFET, for example) (right) at the interface of both materials (i.e. at the interface of the material of the source region and the material of the body region, for example). The increase of the on-current ($I_{on}$) e.g. achieved by the two modifications is shown in FIGS. 6A to 6C.

FIGS. 6A to 6C show diagrams illustrating the dependence of increase of the on-current of a TFET device on halo doping for various TFET device variants.

FIG. 6A shows a first diagram 600 illustrating the dependence of increase of the on-current of a TFET device on halo doping, wherein the SiGe body region includes a Ge content of 40% and the type of TFET device is a double gate non-ambipolar TFFT device and an operating voltage $V_{DD}$ of 0.4 V has been used. Three different variants were examined, namely a first variant being configured to show an off-current $I_{off}$ of 0.01 pA/μm with different halo doping concentrations in the tunneling region (the measured on-currents $I_{on}$ are shown in the first diagram 600 using rectangle symbols 602);

a second variant being configured to show an off-current $I_{off}$ of 0.1 pA/μm with different halo doping concentrations in the tunneling region (the measured on-currents $I_{on}$ are shown in the first diagram 600 using circle symbols 604); and a third variant being configured to show an off-current $I_{off}$ of 1 pA/μm with different halo doping concentrations in the tunneling region (the measured on-currents $I_{on}$ are shown in the first diagram 600 using triangle symbols 606).

FIG. 6B shows a second diagram 620 illustrating the dependence of increase of the on-current of a TFET device on halo doping, wherein the SiGe body region includes a Ge content of 40% and the type of TFET device is a single gate non-ambipolar TFET device and an operating voltage $V_{DD}$ of 0.4 V has been used. Three different variants were examined, namely a first variant being configured to show an off-current $I_{off}$ of 0.01 pA/μm with different halo doping concentrations in the tunneling region (the measured on-currents $I_{on}$ are shown in the second diagram 600 using rectangle symbols 622);

a second variant being configured to show an off-current $I_{off}$ of 0.1 pA/μm with different halo doping concentrations in the tunneling region (the measured on-currents $I_{on}$ are shown in the second diagram 620 using circle symbols 624); and a third variant being configured to show an off-current $I_{off}$ of 1 pA/μm with different halo doping concentrations in the tunneling region (the measured on-currents $I_{on}$ are shown in the second diagram 620 using triangle symbols 626).

FIG. 6C shows a third diagram 640 illustrating the dependence of increase of the on-current of a TFET device on halo doping, wherein the SiGe body region includes a Ge content of 40% and the type of TFET device is a double gate ambipolar TFET device and an operating voltage $V_{DD}$ of 0.4 V has been used. Three different variants were examined, namely a first variant being configured to show an off-current $I_{off}$ of 0.0 1 pA/μm with different halo doping concentrations in the tunneling region (the measured on-currents $I_{on}$ are shown in the third diagram 640 using rectangle symbols 642);

a second variant being configured to show an off-current $I_{off}$ of 0.01 pA/μm with different halo doping concentrations in the tunneling region (the measured on-currents $I_{on}$ are shown in the third diagram 640 using circle symbols 644); and a third variant being configured to show an off-current $I_{off}$ of 1 pA/μm with different halo doping concentrations in the tunneling region (the measured on-currents $I_{on}$ are shown in the third diagram 640 using triangle symbols 646).

An enhancement of the on-current ($I_{on}$) by a factor 5 to 10 is shown in FIGS. 6A to 6C. In various embodiments, an abrupt pn-junction (in an n-channel TFET, for example) or np-junction (in a p-channel TFET, for example) is placed (right) at the heterojunction (i.e. at the interface of the material of the source region and the material of the body region, for example).

In some embodiments, the placement of the abrupt pn-junction (or np-junction) is provided in a simple manner providing a grown vertical structure as will be explained in more detail below. In the manufacturing of a grown vertical structure, an appropriate in-situ doping during the layer growth may be carried out.

Figure 7:
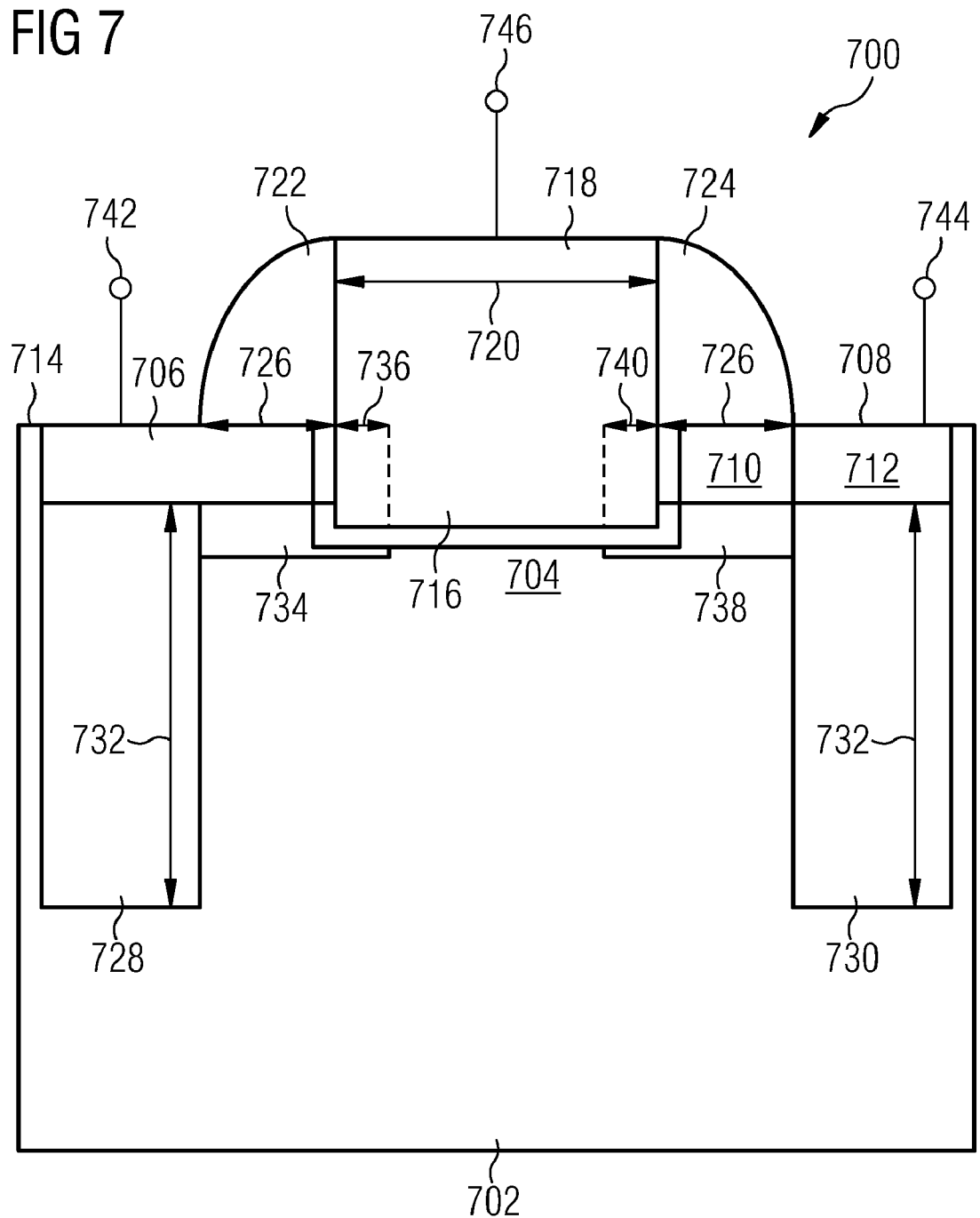
FIG. 7 shows an implementation of an embodiment of a lateral TFET semiconductor device.

An implementation of an embodiment of a lateral (e.g. n-channel) TFET semiconductor device 700 in a close-to-standard CMOS process is shown in FIG. 7.

In an implementation, the TFET semiconductor device 700 may include a substrate 702 such as e.g. a substrate 702 as described with reference to the semiconductor device 100 of FIG. 1. In an implementation, the substrate 702 may be a silicon substrate 702 including an intrinsic silicon (i-Si) body region 704.

The TFET semiconductor device 700 may further include a first source/drain region 706, e.g. a source region 702, formed in or above the substrate 702. In an implementation, the source region 706 may contain or consist of SiGe, e.g. being highly p doped (p$^+$ doped) with doping atoms (e.g. with boron (B)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. The source region 706 may have a thickness in the range from about 4 nm to about 50 nm, e.g. a thickness in the range from about 7.5 nm to about 15 nm, e.g. a thickness of about 4 nm to about 10 nm.

In an implementation, the TFET semiconductor device 700 may further include a second source/drain region 708, e.g. a drain region 708, formed in or above the substrate 702. In an implementation, the drain region 708 may contain or consist of SiGe, e.g. being highly n doped (n$^+$ doped) with doping atoms (e.g. with phosphorous (P) or arsenic (As)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. The drain region 708 may have a thickness in the range from about 4 nm to about 50 nm, e.g. a thickness in the range from about 7.5 nm to about 15 nm, e.g. a thickness of about 4 nm to about 10 nm. In an implementation, the drain region 708 may include a first partial drain region 710 and a second partial drain region 712 being located next to each other, wherein the first partial drain region 710 is located nearer to the body region 704 than the second partial drain region 712. In this implementation, the first partial drain region 710 may contain or consist of p doped SiGe, e.g. with a doping concentration in the range from about $10^{17}$ cm$^{-3}$ to about $10^{20}$ cm$^{-3}$, e.g. with a doping concentration in the range from about $10^{17}$ cm$^{-3}$ to about $10^{18}$ cm$^{-3}$. Furthermore, the second partial drain region 712 may be highly n doped (n$^+$ doped) with doping atoms (e.g. with phosphorous (P) or arsenic (As)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$.

In an implementation, a recess may be formed in the substrate 702 laterally separating the source region 706 and the drain region 708 from one another. The recess may have a depth such that the bottom surface of the recess is approximately aligned to the bottom surface of the source region 706 and/or the drain region 708. In alternative implementations, the recess may extend even deeper into the substrate 702 than the source region 706 and/or the drain region 708 in the direction perpendicular to the main processing surface 714 of the substrate 702. In other words, the bottom surface of the recess may be arranged below the bottom surface of the source region 706 and/or the drain region 708. Furthermore, a gate dielectric layer 716 may be disposed on the exposed sidewalls of the source region 706 and the drain region 708 as well as the bottom surface of the recess. Thus, illustratively, the gate dielectric layer 716 may have a U-shape. The gate dielectric layer 716 may include or consist of a dielectric material such as e.g. silicon oxide ($SiO_2$) or a high k dielectric material (i.e. e.g. a material having a dielectric constant of greater than the dielectric constant of silicon oxide (which has a dielectric constant of 3.9)). In various implementations, the gate dielectric layer 716 may include or consist of aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In an implementation, the gate dielectric layer 716 may include or consist of a dielectric layer stack including three dielectric layers being formed above one another, e.g. a first oxide layer (e.g. silicon oxide), a nitride layer as charge trapping layer (e.g. silicon nitride) on the first oxide layer, and a second oxide layer (e.g. silicon oxide or aluminum oxide) on the nitride layer. This type of dielectric layer stack is also referred to as ONO layer stack. In an alternative implementation, the gate dielectric layer 716 may include or consist of two, four or even more dielectric layers being formed above one another. In various implementations, the gate dielectric layer 716 may have a physical layer thickness in the range from about 1.5 nm to about 5 nm, e.g. a physical layer thickness in the range from about 2 nm to about 3 nm and/or an equivalent oxide thickness (EOT) in the range from about 1 nm to about 2 nm.

In an implementation, a gate region 718 may be disposed over the gate dielectric layer 716. The gate region 718 may include or consist of electrically conductive material such as e.g. polysilicon (doped or undoped) or a metal such as a silicide (e.g. WSi). The width of the gate region 718 is symbolized in FIG. 7 by means of a first double arrow 720 and may be in the range from about 20 nm to about 60 nm, e.g. in the range from about 30 nm to about 50 nm, e.g. about 40 nm. The gate region 718 may extend (in the direction perpendicular to the main processing surface 714 of the substrate 702) along a portion of the sidewall of the source region 706 (with a portion of the gate dielectric layer 716 between them to electrically isolate the gate region 718 from the source region 706), optionally along a portion of the sidewall of the drain region 708 (with a portion of the gate dielectric layer 716 between them to electrically isolate the gate region 718 from the drain region 708) and further above the upper surface of the source region 706 and the drain region 708.

In an implementation, electrically isolating sidewall spacers 722, 724 may be provided next to a portion of the gate region 718 that projects from the upper surface 714 of the substrate 702. A first sidewall spacer 722 may be disposed over a portion of the source region 706, and a second sidewall spacer 724 may be disposed over a portion of the drain region 708, e.g. above the first partial drain region 710. The sidewall spacers 722, 724 may include or consist of e.g. silicon oxide or silicon nitride. The width of the sidewall spacers 722, 724 is symbolized in FIG. 7 by means of second double arrows 726 and may be in the range from about 10 nm to about 40 nm, e.g. in the range from about 25 nm to about 35 nm, e.g. about 30 nm.

Furthermore, in an implementation, a first well region 728 may be provided in the substrate 702 below the source region 706, e.g. below a portion of the source region 706, e.g. below the portion of the source region 706 the upper surface of which is free of the first sidewall spacer 722. The first well region 728 may be highly p doped (in case the source region 706 is also p doped), e.g. having a well doping concentration, which may be in the range from about $10^{19}$ $cm^{-3}$ to about $10^{21}$ $cm^{-3}$, e.g. in the range from about $5*10^{19}$ $cm^{-3}$ to about $5*10^{20}$ $cm^{-3}$, e.g. about $10^{20}$ $cm^{-3}$. Furthermore, a second well region 730 may be provided in the substrate 702 below the drain region 708, e.g. below a portion of the drain region 708, e.g. below the second partial drain region 712, the upper surface of which is free of the second sidewall spacer 724. The second well region 730 may be highly n doped (in case the drain region 708 is also n doped), e.g. having a well doping concentration, which may be in the range from about $10^{19}$ $cm^{-3}$ to about $10^{21}$ $cm^{-3}$, e.g. in the range from about $5*10^{19}$ $cm^{-3}$ to about $5*10^{20}$ $cm^{-3}$, e.g. about $10 cm^{20} cm^{-3}$. The well regions 728, 730 may extend into the substrate 702 starting from the bottom surface of the source region 706 or the drain region 708 by a depth in the range from about 20 nm to about 200 nm, e.g. by a depth in the range from about 40 nm to about 100 nm, by a depth of about 70 nm, in FIG. 7 symbolized by means of third double arrows 732.

Furthermore, in an implementation, a first halo region 734 may be provided (e.g. electrically coupled) between a portion of the source region 706 close to the gate region 718 and the body region 704 (the first halo region 734 being isolated from the gate region by means of a portion of the gate dielectric layer 716) next to the first well region 728 and laterally between the first well region 728 and the body region 704, thereby illustratively forming a tunneling region between the source region 706 and the body region 704. In an implementation, the first halo region 734 is doped with doping atoms of a different conductivity type as the doping atoms of the source region 706. Thus, the first halo region 734 may be n doped with n doping atoms (in case the source region 706 is highly p doped). In an implementation, the first halo region 734 may be n doped with a doping concentration in the range from about $10^{17}$ $cm^{-3}$ to about $10^{19}$ $cm^{-3}$, e.g. with a doping concentration in the range from about $5*10^{17}$ $cm^{-3}$ to about $5*10^{18}$ $cm^{-3}$, e.g. with a doping concentration of about $10^{18}$ $cm^{-3}$. In an implementation, the doping concentration of the first halo region 734 may be smaller than the doping concentration of the source region 706. As shown in FIG. 7, the first halo region 734 may laterally partially overlap the gate region 718 (in other words may laterally extend below a portion of the gate region 718). The lateral overlapping is symbolized in FIG. 7 by means of a fourth double arrow 736. The lateral overlapping may be in the range from about 1 nm to about 10 nm, e.g. in the range from about 2 nm to about 3 nm.

In an alternative implementation, a portion of the source region 706 which may be e.g. the portion of the source region 706 the upper surface of which is covered by the first sidewall spacer 722 may also form a part of the tunneling region. In yet an alternative implementation, the first halo region 734 may be omitted and only a portion of the source region 706 may be configured as a tunneling region, e.g. by means of differently doping this portion functioning as a tunneling region compared with the rest of the source region 706 to form an abrupt pn-junction (in an n-channel TFET, for example) or np-junction (in a p-channel TFET, for example) at the interface of the material of the source region 706 and the material of the tunneling region.

As an option, in an implementation, a second halo region 738 may be provided below the a portion of the drain region 708 (e.g. below the first partial drain region 710) and a portion of the gate region 718 (being isolated from the gate region by means of a portion of the gate dielectric layer 716) next to the second well region 730 and laterally between the second well region 730 and the body region 704. In an implementation, the second halo region 738 is doped with doping atoms of a different conductivity type as the doping atoms of the drain region 708. Thus, the second halo region 738 may be n doped with n doping atoms (in case the drain region 708 is highly p doped). In an implementation, the second halo region 738 may be n doped with a doping concentration in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$. In an implementation, the doping concentration of the second halo region 738 may be smaller than the doping concentration of the drain region 708. As shown in FIG. 7, the second halo region 738 may laterally partially overlap the gate region 718 (in other words may laterally extend below a portion of the gate region 718). The lateral overlapping is symbolized in FIG. 7 by means of a fifth double arrow 740. The lateral overlapping may be in the range from about 1 nm to about 10 nm, e.g. in the range from about 2 nm to about 3 nm.

The exposed upper surface of the source region 706 may be contacted to a source terminal 742 (e.g. via a source line), the exposed upper surface of the drain region 708 may be contacted to a drain terminal 744 (e.g. via a drain line), and the exposed upper surface of the gate region 718 may be contacted to a gate terminal 746 (e.g. via a gate line).

The above mentioned dimensioning may be provided e.g. when using a 50 nm (CMOS) process capability, and may vary with using a different technology node. Thus, it is to be noted that the dimensions given are only for illustrative purposes and are not intended to have a limiting character.

An on-current ($I_{on}$) of greater than 100 μA/μm at an operating voltage $V_{DD}$ of 0.4 V may be achieved with the semiconductor devices in accordance with various embodiments, e.g. for a halo heterojunction TFET, in other words, for a TFET having a halo region between the source region and the body region (this type of TFET will also be referred to as HH-TFET in the following) using 32 nm technology node parameters, while the off-current ($I_{off}$) may still be kept in the fA/μm regime.

By adjusting the halo overlap (i.e. e.g. the vertical and/or lateral overlapping area of e.g. the first halo region with the gate region) as e.g. symbolized by means of the fourth double arrow 736 in FIG. 7, the doping concentration of the halo region (in general, of the tunneling region), e.g. of the first halo region 734, the gate length, and e.g. the germanium content, the transistor parameters on-current ($I_{on}$), off-current ($I_{off}$) and sub-threshold swing may largely be influenced.

It should be mentioned that various embodiments work for as such conventional SiO$_2$/polysilicon gate stacks as well as for metal/high k-material gate stacks.

In various embodiments, a low EOT (equivalent oxide thickness) may be provided.

Figure 8:
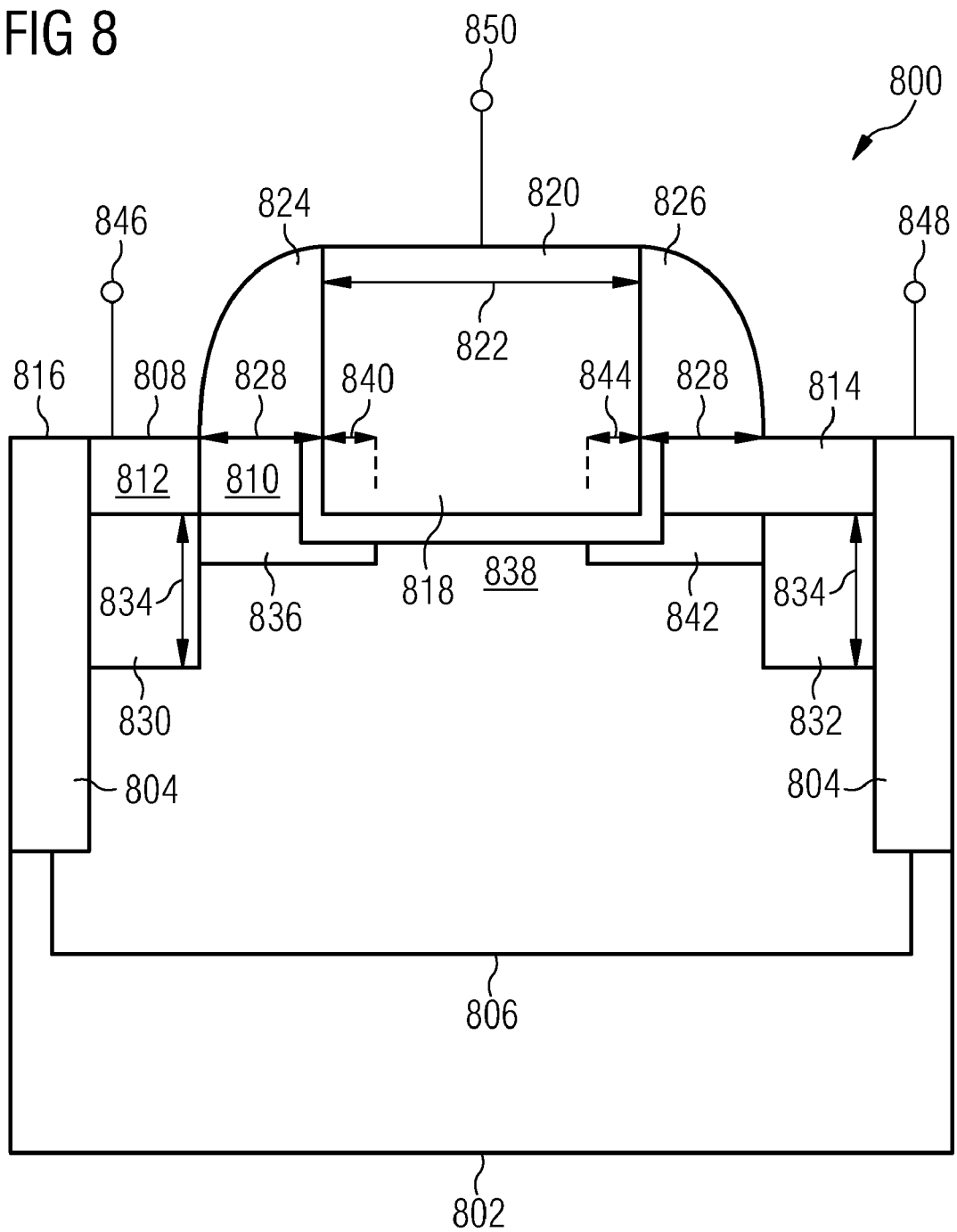
FIG. 8 shows another implementation of an embodiment of a lateral TFET semiconductor device.

Another implementation of an embodiment of a lateral (e.g. p-channel) TFET semiconductor device 800 in a close-to-standard CMOS process is shown in FIG. 8.

In an implementation, the TFET semiconductor device 800 may include a substrate 802 (e.g. a p doped substrate 802) such as e.g. a substrate 802 as described with reference to the semiconductor device 100 of FIG. 1. In an implementation, the substrate 802 may be a silicon substrate 802, e.g. a p doped silicon substrate 802.

The TFET semiconductor device 800 may be laterally terminated by shallow trench isolations (STIs) 804, 806 to electrically isolate the TFET semiconductor device 800 from adjacent semiconductor devices provided in the substrate 802. Furthermore, a well region 806 may be provided (in this implementation for example an n doped well region 806), in which the TFET semiconductor device 800 may be formed. The well region 806 may be highly n doped, e.g. having a well doping concentration, which may be in the range from about $10^{19}$ cm$^{-3}$ to about $10^{21}$ cm$^{-3}$, e.g. in the range from about $5*10^{19}$ cm$^{-3}$ to about $5*10^{20}$ cm$^{-3}$, e.g. about $10^{20}$ cm$^{-3}$.

The TFET semiconductor device 800 may further include a first source/drain region 808, e.g. a source region 808, formed in or above the substrate 802. In an implementation, the source region 808 may contain or consist of SiGe, e.g. being highly p doped (p$^+$ doped) with doping atoms (e.g. with boron (B)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. The source region 808 may have a thickness in the range from about 4 nm to about 50 nm, e.g. a thickness in the range from about 7.5 nm to about 15 nm, e.g. a thickness of about 4 nm to about 10 nm. In an implementation, the source region 808 may include a first partial source region 810 and a second partial source region 812 being located next to each other, wherein the first partial drain region 810 is located nearer to the body region 838 than the second partial drain region 812. In this implementation, the first partial drain region 810 may contain or consist of highly n doped (n$^+$ doped) SiGe, e.g. doped with doping atoms (e.g. with phosphorous (P) or arsenic (As)) with a doping concentration of doping atoms in the range from about $10^{19}$ cm$^{-3}$ to about $10^{19}$ cm$^{-3}$, e.g. with a doping concentration of doping atoms in the range from about $5*10^{19}$ cm$^{-3}$ to about $5*10^{20}$ cm$^{-3}$. In an alternative implementation, the first partial drain region 810 may contain or consist of intrinsically n doped or undoped SiGe. Furthermore, the second partial source region 812 may be highly p doped (p$^+$ doped) with doping atoms (e.g. with boron (B)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$.

In an implementation, the TFET semiconductor device 800 may further include a second source/drain region 814, e.g. a drain region 814, formed in or above the substrate 802. In an implementation, the drain region 814 may contain or consist of SiGe, e.g. being highly n doped (n$^+$ doped) with doping atoms (e.g. with phosphorous (P) or arsenic (As)) with a doping concentration of doping atoms in the range from about $10^{19}$ cm$^{-3}$ to about $10^{21}$ cm$^{-3}$, e.g. with a doping concentration of doping atoms in the range from about $5\times10^{19}$ c to about $5\times10^{20}$ cm$^{-3}$. The drain region 814 may have a thickness in the range from about 4 nm to about 50 nm, e.g. a thickness in the range from about 7.5 nm to about 15 nm, e.g. a thickness of about 4 nm to about 10 nm.

In an implementation, a recess may be formed in the substrate 802 laterally separating the source region 808 and the drain region 814 from one another. The recess may have a depth such that the bottom surface of the recess is aligned to the bottom surface of the source region 808 and/or the drain region 814. In alternative implementations, the recess may extend even deeper into the substrate 802 than the source region 808 and/or the drain region 814 in the direction perpendicular to the main processing surface 816 of the substrate 802. In other words, the bottom surface of the recess may be arranged below the bottom surface of the source region 808 and/or the drain region 814. Furthermore, a gate dielectric layer 818 may be disposed on the exposed sidewalls of the source region 808 and the drain region 814 as well as the bottom surface of the recess. Thus, illustratively, the gate dielectric layer 818 may have a U shape. The gate dielectric layer 818 may include or consist of a dielectric material such as e.g. silicon oxide ($SiO_2$) or a high k dielectric material (i.e. e.g. a material having a dielectric constant of greater the than the dielectric constant of silicon oxide (which has a dielectric constant of 3.9)). In various implementations, the gate dielectric layer 818 may include or consist of aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In an implementation, the gate dielectric layer 716 may include or consist of a dielectric layer stack including three dielectric layers being formed above one another, e.g. a first oxide layer (e.g. silicon oxide), a nitride layer as charge trapping layer (e.g. silicon nitride) on the first oxide layer, and a second oxide layer (e.g. silicon oxide or aluminum oxide) on the nitride layer. This type of dielectric layer stack is also referred to as ONO layer stack. In an alternative implementation, the gate dielectric layer 818 may include or consist of two, four or even more dielectric layers being formed above one another. In various implementations, the gate dielectric layer 818 may have a physical layer thickness in the range from about 1.5 nm to about 5 nm, e.g. a physical layer thickness in the range from about 2 nm to about 3 nm and/or an equivalent oxide thickness (EOT) in the range from about 1 nm to about 2 nm.

In an implementation, a gate region 820 may be disposed over the gate dielectric layer 818. The gate region 820 may include or consist of electrically conductive material such as e.g. polysilicon (doped or undoped) or a metal such as a silicide (e.g. WSi). The width of the gate region 820 is symbolized in FIG. 8 by means of a first double arrow 822 and may be in the range from about 20 nm to about 60 nm, e.g. in the range from about 30 nm to about 50 nm, e.g. about 40 nm. The gate region 820 may extend (in the direction perpendicular to the main processing surface 816 of the substrate 802) along a portion of the sidewall of the source region 808 (with a portion of the gate dielectric layer 818 between them to electrically isolate the gate region 820 from the source region 808), optionally along a portion of the sidewall of the drain region 814 (with a portion of the gate dielectric layer 818 between them to electrically isolate the gate region 820 from the drain region 814) and further above the upper surface of the source region 808 and the drain region 814.

In an implementation, electrically isolating sidewall spacers 824, 826 may be provided next to a portion of the gate region 820 that projects from the upper surface 816 of the substrate 802. A first sidewall spacer 824 may be disposed over a portion of the source region 808, e.g. above the first partial source region 810, and a second sidewall spacer 826 may be disposed over a portion of the drain region 814. The sidewall spacers 824, 826 may include or consist of e.g. silicon oxide or silicon nitride. The width of the sidewall spacers 824, 826 is symbolized in FIG. 8 by means of second double arrows 828 and may be in the range from about 20 nm to about 40 nm, e.g. in the range from about 25 nm to about 35 nm, e.g. about 30 nm.

Furthermore, in an implementation, a first highly doped drain ($p^+$ HDD) region 830 may be provided in the substrate 802 below the source region 808, e.g. below the first partial source region 810, e.g. below the portion of the source region 808 the upper surface of which is free of the first sidewall spacer 824. The first highly doped drain region 830 may be highly p doped (in case the source region 808 is also p doped) having a doping concentration in the range from about $10^{19}$ $cm^{-3}$ to about $10^{20}$ $cm^{-3}$, e.g. in the range from about $5*10^{19}$ $cm^{-3}$ to about $5*10^{20}$ $cm^{-3}$, e.g. about $10^{20}$ $cm^{-3}$.

Furthermore, a second highly doped drain ($n^+$ HDD) region 832 may be provided in the substrate 802 below the drain region 814, e.g. below a portion of the drain region 814 the upper surface of which is free of the second sidewall spacer 826. The second highly doped drain region 832 may be highly n doped (in case the drain region 708 is also n doped), e.g. having a well doping concentration, which may be in the range from about $10^{19}$ $cm^{-3}$ to about $10^{21}$ $cm^{-3}$, e.g. in the range from about $5*10^{19}$ $cm^{-3}$ to about $5*10^{20}$ $cm^{-3}$ e.g. about $10^{20}$ $cm^{-3}$. The highly doped drain regions 830, 832 may extend into the substrate 802 starting from the bottom surface of the source region 808 or the drain region 814 by a depth in the range from about 20 nm to about 200 nm, e.g. by a depth in the range from about 40 nm to about 100 nm, in FIG. 8 symbolized by means of third double arrows 834.

Furthermore, in an implementation, a first halo region 836 may be provided below the a portion of the source region 808 and a portion of the gate region 820 (the first halo region 836 being isolated from the source region 808 by means of a portion of the gate dielectric layer 818) next to the first highly doped drain region 830 and laterally between the first highly doped drain region 830 and the body region 838, thereby illustratively forming a tunneling region electrically coupled between the source region 808 and the body region 838. In an implementation, the first halo region 836 is doped with doping atoms of the same conductivity type as the doping atoms of the source region 808. Thus, the first halo region 836 may be p doped with p doping atoms (in case the source region 808 is highly p doped). In an implementation, the first halo region 836 may be n doped with a doping concentration in the range from about $10^{17}$ $cm^{-3}$ to about $10^{19}$ $cm^{-3}$, e.g. with a doping concentration in the range from about $5*10^{17}$ $cm^{-3}$ to about $5*10^{18}$ $cm^{-3}$, e.g. with a doping concentration of about $10^{18}$ $cm^{-3}$. In an implementation, the doping concentration of the first halo region 836 may be smaller than the doping concentration of the source region 808. As shown in FIG. 8, the first halo region 836 may laterally partially overlap the gate region 820 (in other words may laterally extend below a portion of the gate region 820). The lateral overlapping is symbolized in FIG. 8 by means of a fourth double arrow 840. The lateral overlapping may be in the range from about 1 nm to about 10 nm, e.g. in the range from about 2 nm to about 3 nm.

In an implementation, a portion of the source region 808 which may be e.g. the first partial source region 810, the upper surface of which is covered by the first sidewall spacer 824, may also form a part of the tunneling region. In yet an alternative implementation, the first halo region 836 may be omitted and only a portion of the source region 808 (e.g. the first partial source region 810) may be configured as a tunneling region, e.g. by means of differently doping this portion functioning as a tunneling region compared with the rest of the source region 808 to form an abrupt pn-junction (in an n-channel TFET, for example) or np-junction (in a p-channel TFET, for example) at the interface of the material of the source region 808 and the material of the tunneling region.

As an option, in an implementation, a second halo region 842 may be provided below the a portion of the drain region 814 and a portion of the gate region 820 (the second halo region 842 being isolated from the gate region 820 by means of a portion of the gate dielectric layer 818) next to the second highly doped drain region 832 and laterally between the second highly doped drain region 832 and the body region 838. In an implementation, the second halo region 842 is doped with doping atoms of a different conductivity type as the doping atoms of the drain region 814. Thus, the second halo region 842 may be n doped with n doping atoms (in case the drain region 814 is highly p doped). In an implementation, the second halo region 842 may be n doped with a doping concentration in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$. In an implementation, the doping concentration of the second halo region 842 may be smaller than the doping concentration of the drain region 814. As shown in FIG. 8, the second halo region 842 may laterally partially overlap the gate region 820 (in other words may laterally extend below a portion of the gate region 820). The lateral overlapping is symbolized in FIG. 8 by means of a fifth double arrow 844. The lateral overlapping may be in the range from about 1 nm to about 10 nm, e.g. in the range from about 2 nm to about 3 nm.

The exposed upper surface of the source region 808 may be contacted to a source terminal 846 (e.g. via a source line), the exposed upper surface of the drain region 814 may be contacted to a drain terminal 848 (e.g. via a drain line), and the exposed upper surface of the gate region 820 may be contacted to a gate terminal 850 (e.g. via a gate line).

FIGS. 9A to 9G show a process flow for manufacturing the lateral TFET semiconductor device 800 of FIG. 8. In this process flow, it is assumed that the n-Halo implant doping concentration which will be described in more detail below is smaller than the p$^+$ doping of the SiGe layer which will be described in more detail below.

Figure 9A:
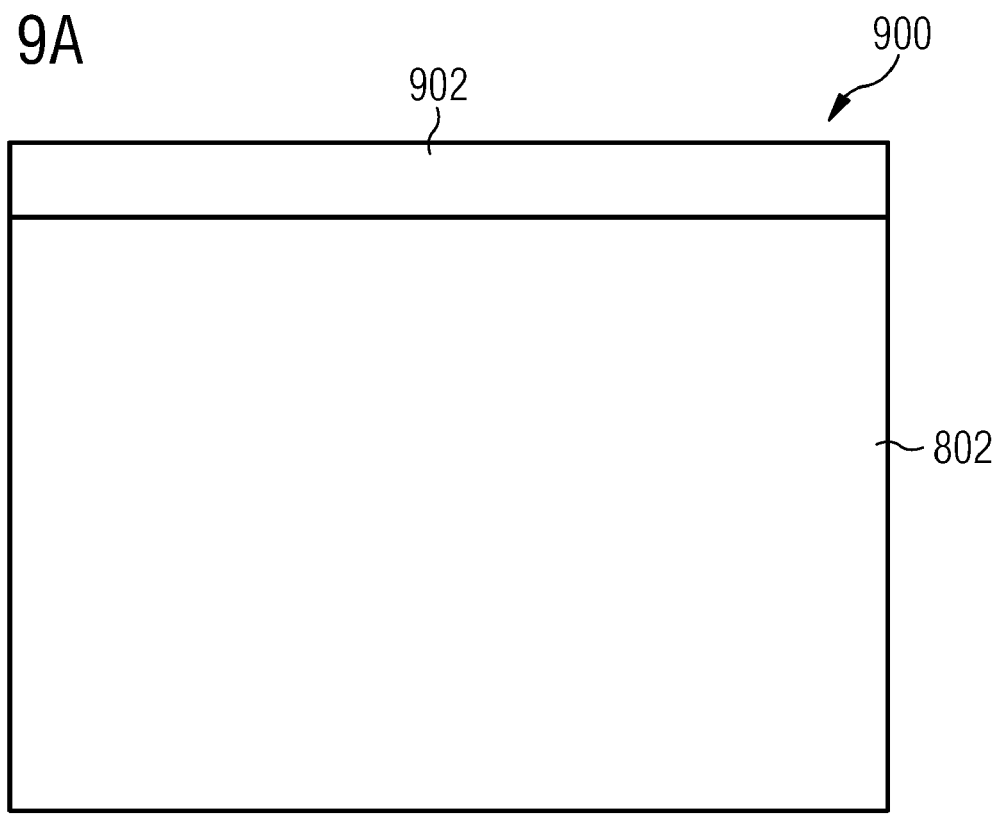

As shown in FIG. 9A, which illustrates a first stage 900 of the manufacturing of the lateral TFET semiconductor device 800 of FIG. 8, a highly p doped silicon germanium layer 902 is formed in or above a substrate 802 (e.g. a p doped substrate 802) such as e.g. a substrate 802 as described with reference to the semiconductor device 100 of FIG. 1, e.g. a silicon substrate 802, e.g. a p doped silicon substrate 802.

Figure 9B:
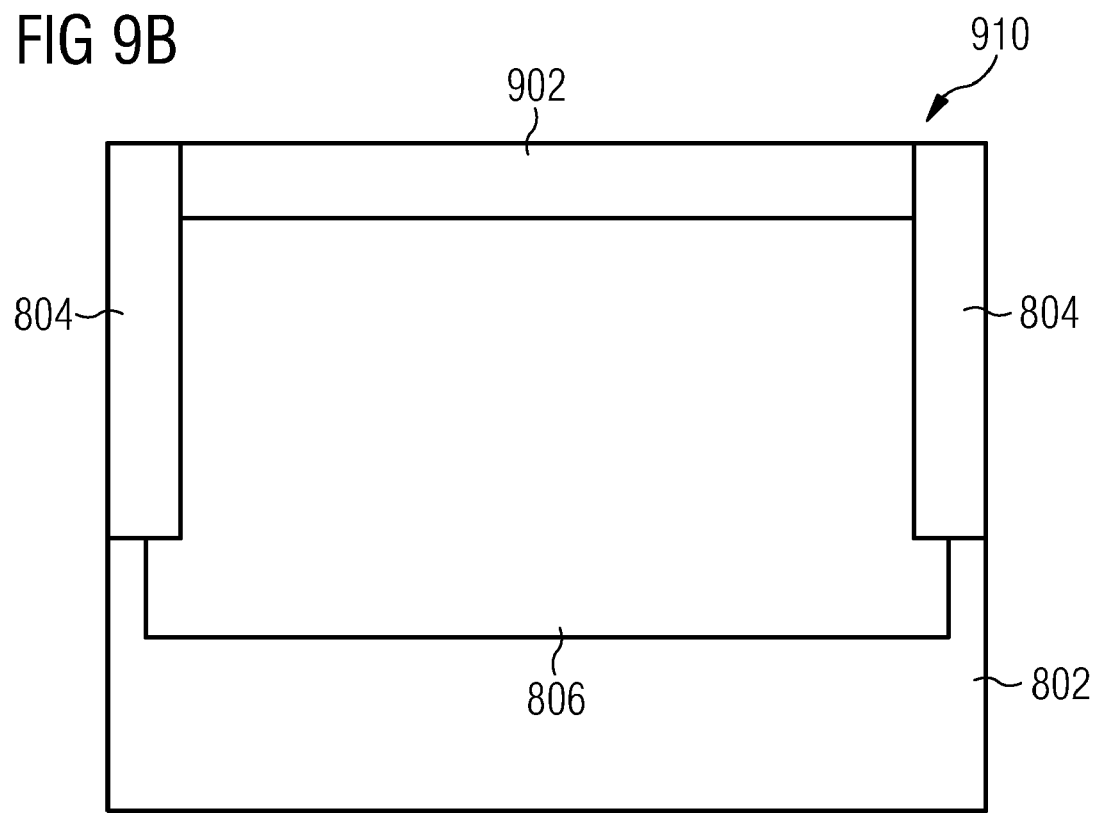

Then, as shown in FIG. 9B, which illustrates a second stage 910 of the manufacturing of the lateral TFET semiconductor device 800 of FIG. 8, an optional well region 806 may be formed (in this implementation for example an n doped well region 806), in which the TFET semiconductor device 800 may be formed. The well region 806 may be formed as a highly n doped well region using an ion implantation process, e.g. having a well doping concentration, which may be in the range from about $10^{17}$ cm$^{-3}$ to about $10^{19}$ cm$^{-3}$, e.g. in the range from about $5*10^{17}$ cm$^{-3}$ to about $5*10^{18}$ cm$^{-3}$. Furthermore, shallow trench isolations (STIs) 804, 806 to electrically isolate the TFET semiconductor device 800 from adjacent semiconductor devices may be formed in the substrate 802 using an as such conventional STI process.

Figure 9C:
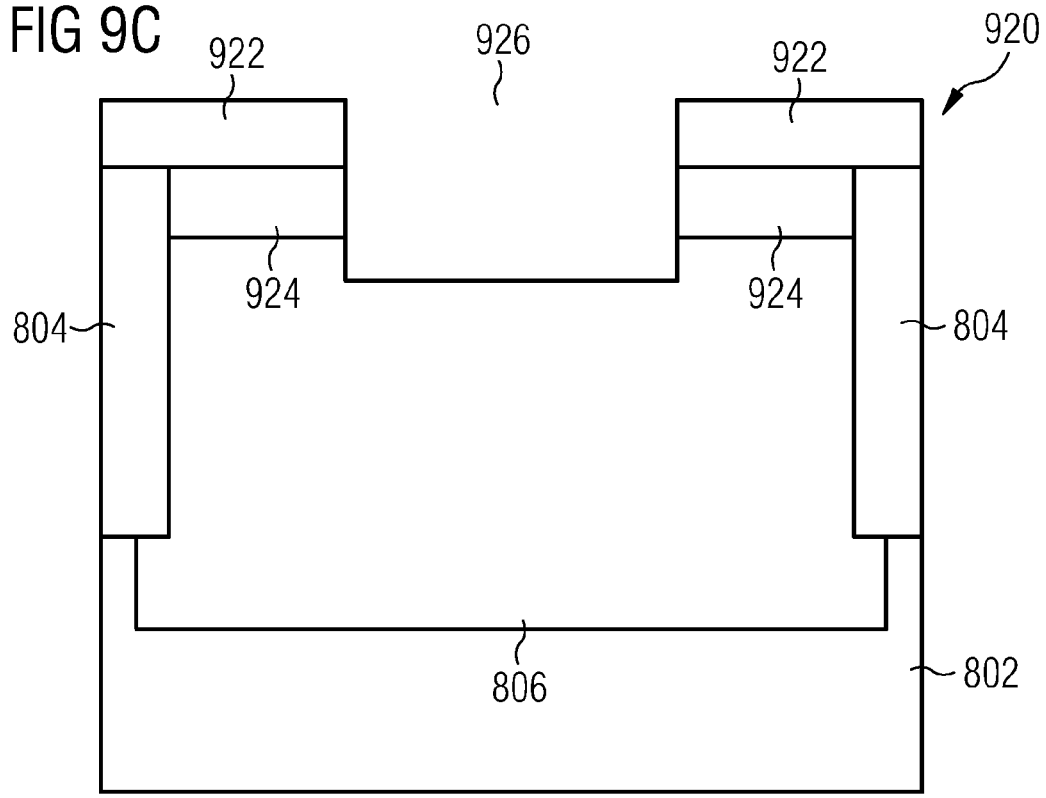

Then, as shown in FIG. 9C, which illustrates a third stage 920 of the manufacturing of the lateral TFET semiconductor device 800 of FIG. 8, a hard mask layer 922 may be deposited on the upper surface of the highly p doped silicon germanium layer 902. The hard mask layer 922, which may include or consist of silicon oxide, silicon nitride or carbon, for example, may be patterned using a lithography process and an etching process (e.g. an anisotropic etching process). Using the patterned hard mask, those portions of the silicon germanium layer 902 the upper surface of which is exposed from the hard mask layer 922 are removed, e.g. using an etching process, thereby forming a recess 926 exposing the upper surface of the substrate 802 in these regions and forming a patterned highly p doped silicon germanium layer 924.

Figure 9D:
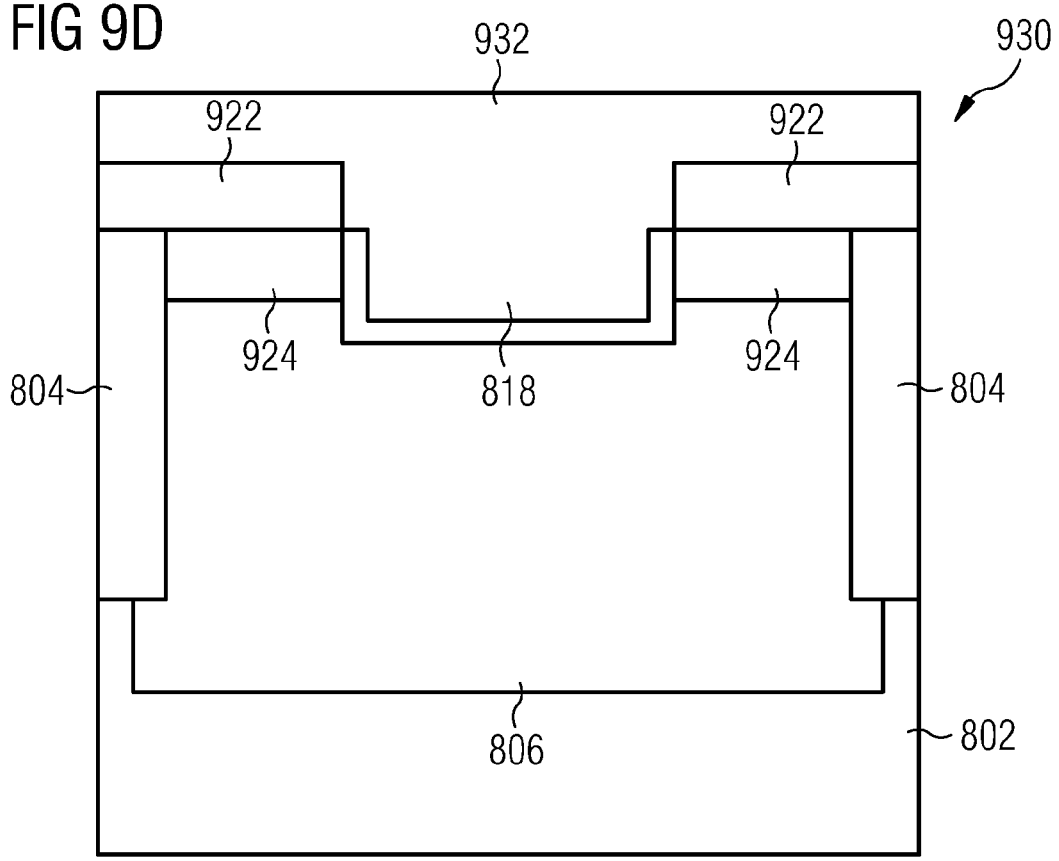

Next, as shown in FIG. 9D, which illustrates a fourth stage 930 of the manufacturing of the lateral TFET semiconductor device 800 of FIG. 8, the gate dielectric layer 818 may be deposited into the recess 926 on the exposed sidewalls of the patterned highly p doped silicon germanium layer 924 as well as the bottom surface of the recess 926. In various implementations, the gate dielectric layer 818 may be formed to have a physical layer thickness in the range from about 1.5 nm to about 5 nm, e.g. a physical layer thickness in the range from about 2 nm to about 3 nm and/or an equivalent oxide thickness (EOT) in the range from about 1 nm to about 2 nm. Then, an electrically conductive layer 932 (e.g. including or consisting of (doped or undoped) polysilicon, or a metal such as e.g. tungsten or a silicide such as e.g. tungsten silicide). The electrically conductive layer 932 is deposited (e.g. using a chemical vapor deposition (CVD) process or a physical vapor deposition (PVD) process such that the deposited material fills and possibly overfills the recess 926.

Next, as shown in FIG. 9E, which illustrates a fifth stage 940 of the manufacturing of the lateral TFET semiconductor device 800 of FIG. 8, using e.g. a chemical mechanical polishing (CMP) process, a portion of the electrically conductive layer 932 is removed, thereby exposing again the upper surfaces of the hard mask layer 922. Thus, the gate region 820 is formed by the remaining portion of the electrically conductive layer 932.

Next, as shown in FIG. 9F, which illustrates a sixth stage 950 of the manufacturing of the lateral TFET semiconductor device 800 of FIG. 8, an inclined halo implantation process using n doping atoms in this implementation may be carried out (symbolized by means of directed arrows 952), thereby forming regions 954 having a halo implant concentration. These regions 954 include the halo regions 836, 842. The doping inclined halo implantation process may be carried out such that the dopant concentration in the regions 954 may be in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$.

Next, as shown in FIG. 9G, which illustrates a seventh stage 960 of the manufacturing of the lateral TFET semiconductor device 800 of FIG. 8, the sidewall spacers 824, 826 may be formed and additional ion implantation processes may be carried out to form the HDD regions 830, 832, respectively having the dopant concentrations as described above with reference to FIG. 8. Then, the above described terminals will be formed (not shown in FIG. 9G), thereby completing the lateral TFET semiconductor device 800.

Figure 10:
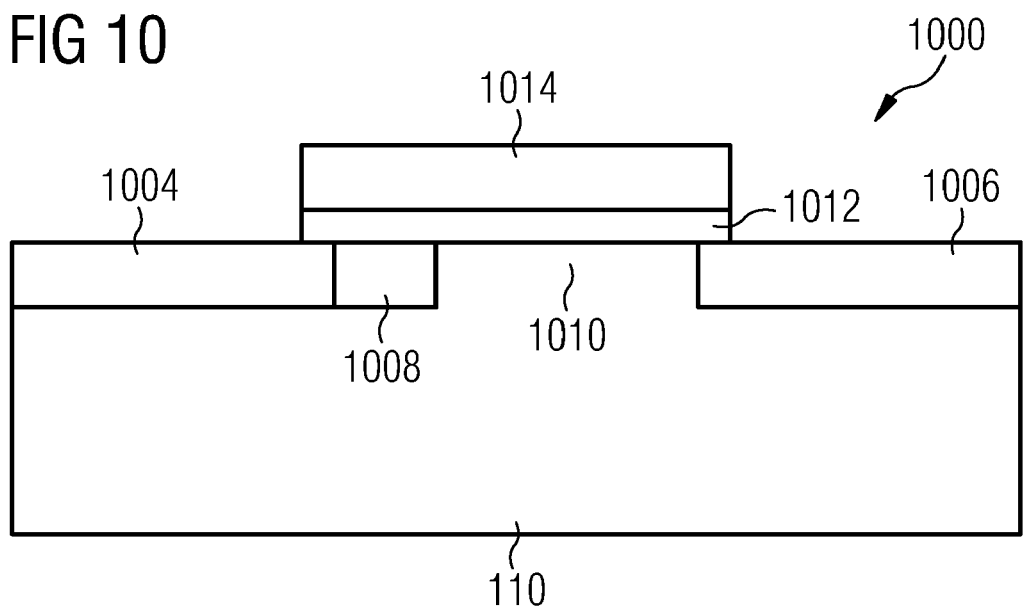
FIG. 10 shows a semiconductor device in accordance with yet another embodiment.

FIG. 10 shows a semiconductor device 1000 in accordance with yet another embodiment.

In accordance with this embodiment, the semiconductor device 1000 may include a first source/drain region 1004 (e.g. a source region 1004) including or consisting of a first material of a first conductivity type. The first source/drain region 1004 may be formed in or above a substrate 1002 such as e.g. a substrate as described above. The semiconductor device 1000 may further include a second source/drain region 1006 (e.g. a drain region 1006) including or consisting of a second material of a second conductivity type, wherein the second conductivity type is different from the first conductivity type. The semiconductor device 1000 may further include a body region 1010 electrically coupled between the first source/drain region 1004 and the second source/drain region 1006, a gate dielectric 1012 disposed over the body region 1010 and a gate region 1014 disposed over the gate dielectric 1012. In various embodiments, a portion of the body region 1010 may be a tunneling region 1008 electrically coupled between the first source/drain region 1004 and the remaining portion of the body region 1010, wherein the tunneling region 1008 may include or consist of material having a different energy band gap than the first material of the first conductivity type and the material of the body region 1010.

In various embodiments, the first material of the first conductivity type may include or consist of semiconductor material, e.g. semiconductor compound material.

By way of example, the first material of the first conductivity type may include one or more of the following materials:

IV-IV semiconductor compound material such as e.g. SiGe (e.g. for an n-channel TFET) or SiC (e.g. for a p-channel TFET);

III-V semiconductor compound material such as e.g. GaAs or InP;

II-VI semiconductor compound material such as e.g. AlGaAs;

a ternary semiconductor compound material; and a quaternary semiconductor compound material.

In various alternative embodiments, the first material of the first conductivity type may include one or more metals such as e.g. a silicide.

In various alternative embodiments, the body region 1010 may include or consist of silicon or silicon germanium.

In various embodiments, the tunneling region 1008 may include or consist of a different material than the first material of the first conductivity type.

In various embodiments, the tunneling region 1008 may include or consist of the same material as the first material of the first conductivity type. In these embodiments, the material of the tunneling region 1008 may have a different concentration of doping atoms than the first material of the first conductivity type in the first source/drain region 1004.

In various embodiments, the tunneling region 1008 may include or consist of material having doping atoms of the second conductivity type.

In various embodiments, the tunneling region 1008 may include or consist of a halo doping region having doping atoms of the second conductivity type (in alternative embodiments, the halo doping region may have doping atoms of the first conductivity type).

In various embodiments, the body region 1010 may include or consist of silicon, e.g. silicon germanium.

In various embodiments, the semiconductor device 1000 may further include a first well region (not shown in FIG. 10) of the first conductivity type, wherein the first source/drain region 1004 is disposed in the first well region. Furthermore, in various embodiments, the semiconductor device 1000 may further include a second well region (not shown in FIG. 10) of the second conductivity type, wherein the second source/drain region 1006 is disposed in the second well region.

In various embodiments, the semiconductor device 1000 may further include a third well region (not shown in FIG. 10) of the second conductivity type, wherein the first well region and the second well region are arranged in the third well region.

In various embodiments, the first material of the first conductivity type may include or consist of semiconductor material having a different energy band gap than the material of the body region 1010. By way of example, the first material of the first conductivity type may include or consist of semiconductor material having a smaller energy band gap than the material of the body region 1010. Alternatively the first material of the first conductivity type may include or consist of semiconductor material having a larger energy band gap than the material of the body region 1010.

In various embodiments, the material of the tunneling region 1008 may include or consist of semiconductor material having a different energy band gap than the material of the body region 1010. By way of example, the material of the tunneling region 1008 may include or consist of semiconductor material having a smaller energy band gap than the material of the body region 1010. Alternatively, the material of the tunneling region 1008 may include or consist of semiconductor material having a larger energy band gap than the material of the body region 1010.

Figure 11:
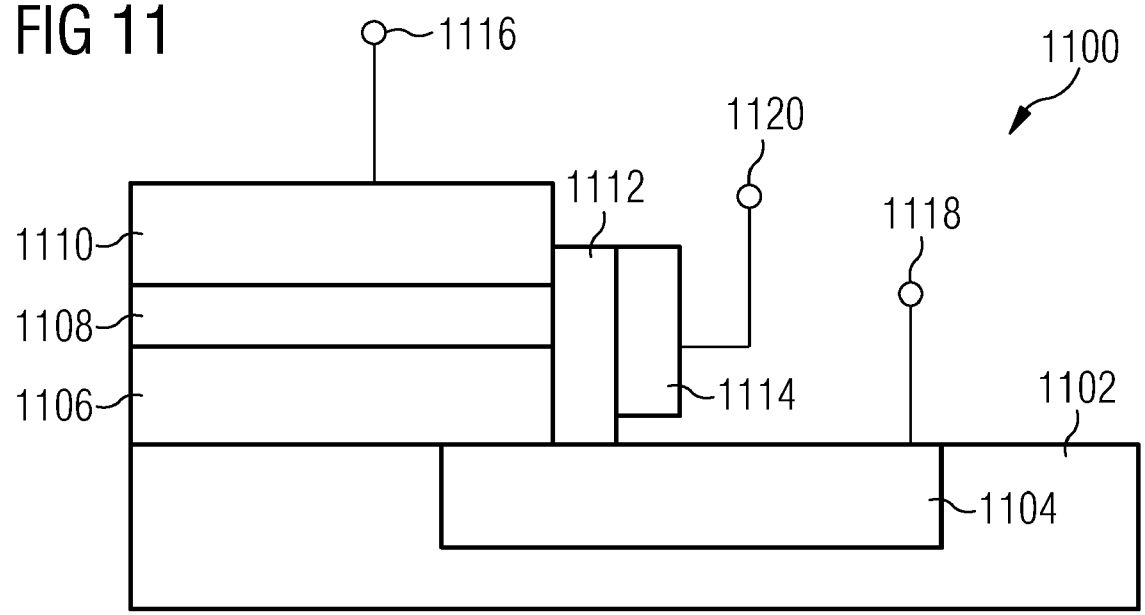
FIG. 11 shows an implementation of a semiconductor device in accordance with the embodiment of FIG. 10.

FIG. 11 shows an implementation of a semiconductor device 1100 in accordance with the embodiment of FIG. 10.

In this implementation, the semiconductor device 1100 is configured as a vertical (single-gate) semiconductor device 1100, e.g. a vertical TFET device 100. The semiconductor device 1100 may include a substrate 1102 (e.g. a p doped substrate 1102) such as e.g. a substrate 1102 as described with reference to the semiconductor device 100 of FIG. 1. In an implementation, the substrate 1102 may be a silicon substrate 1102, e.g. a p doped silicon substrate 1102. A second source/drain region 1104, e.g. a drain region 1104, which in this implementation may be highly n doped (n$^+$ doped) may be formed in the substrate 1102. Then, a layer 1106 of intrinsically doped silicon may be provided above the upper surface of the substrate 1102 such that it overlaps a portion of the second source/drain region 1104. The layer 1106 will form the body region 1106 of the vertical semiconductor device 1100. The layer 1106 may also be a part of the substrate 1102, wherein a portion of the substrate may e.g. be removed to form a stepped substrate and then, the second source/drain region 1104 may be formed in the corner region of the stepped substrate e.g. by means of an inclined ion implantation process. The vertical semiconductor device 1100 may further include a tunneling region 1108, in this case implemented as a halo region 1108, e.g. as a portion of the body region, doped with n doping atoms, i.e. it may be n doped with n doping atoms (in case the source region of the vertical semiconductor device 1100 is highly p doped). In an implementation, the halo region 1108 may be n doped with a doping concentration in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$. Furthermore, a first source/drain region 1110 (e.g. a source region 1110) may be provided as a highly p doped (p$^+$ doped) region of a semiconductor material, e.g. a semiconductor compound material such as e.g. SiGe. The first source/drain region 1110 may be doped with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. The first source/drain region 1110 may have a thickness in the range from about 5 nm to about 100 nm, e.g. a thickness in the range from about 10 nm to about 25 nm, e.g. a thickness of about 5 nm to about 15 nm.

Furthermore, a gate dielectric 1112 may be provided covering at least the an exposed sidewall of the body region 1106, an exposed sidewall of the tunneling region 1108 and optionally a portion of an exposed sidewall of the first source/drain region 1110. The gate dielectric 1112 may have the same layer thickness and may be made of the same material as the gate dielectric layers described above. A gate region 1114 may be provided on the gate dielectric 1112 such that a (tunnel) current flow from the first source/drain region 1110 via the tunneling region 1108, and the body region 1106 to the second source/drain region 1104 may be controlled via the application of appropriate voltages to the source/drain regions 1110, 1104 and the gate region 1106. The gate region 1114 may be made from the same materials as the gate regions described above in the other embodiments and may have similar layer thicknesses. The first source/drain region 1110 may be connected to a source terminal 1116 (e.g. via a source line), the second source/drain region 1104 may be connected to a drain terminal 1118 (e.g. via a drain line), and the gate region 1114 may be connected to a gate terminal 1120 (e.g. via a gate line).

Figure 12:
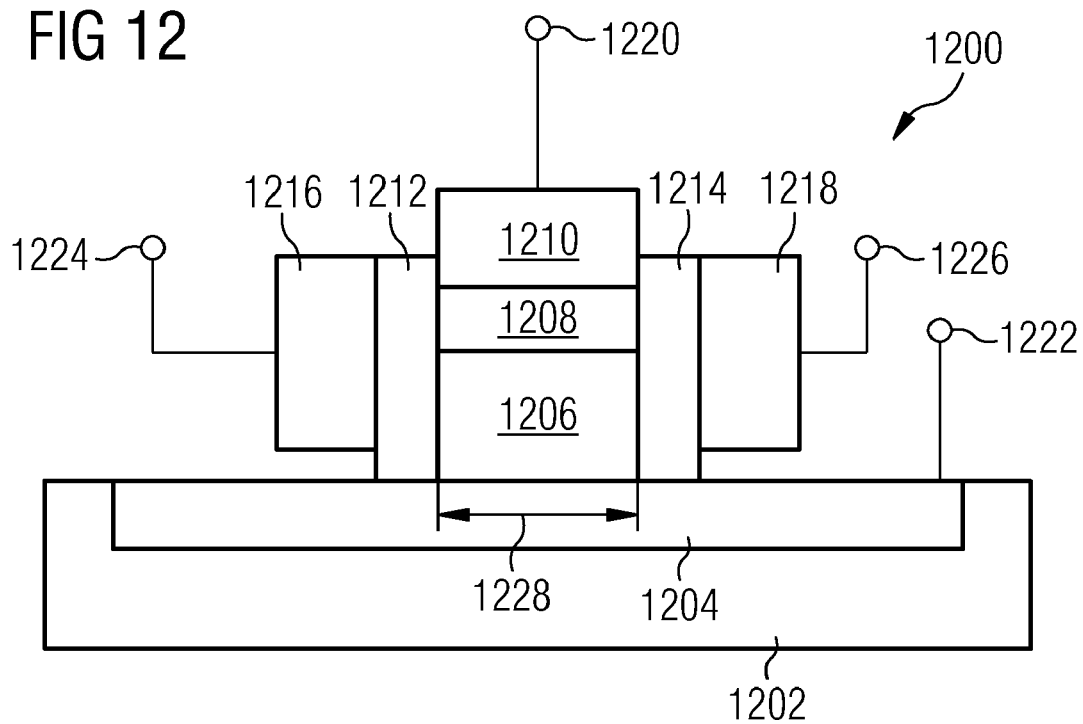
FIG. 12 shows another implementation of a semiconductor device in accordance with the embodiment of FIG. 10.

FIG. 12 shows another implementation of a semiconductor device 1200 in accordance with the embodiment of FIG. 10.

In this implementation, the semiconductor device 1200 is configured as a vertical (double-gate) semiconductor device 1200, e.g. a vertical (double-gate) TFET device 1200. The semiconductor device 1200 may include a substrate 1202 (e.g. a p doped substrate 1202) such as e.g. a substrate 1202 as described with reference to the semiconductor device 100 of FIG. 1. In an implementation, the substrate 1202 may be a silicon substrate 1202, e.g. a p doped silicon substrate 1202. A second source/drain region 1204, e.g. a drain region 1204, which in this implementation may be highly n doped ($n^+$ doped) may be formed in the substrate 1102. Then, a layer 1206 of intrinsically doped silicon may be provided above the upper surface of the substrate 1202 such that it overlaps a portion of the second source/drain region 1204. The layer 1206 will form the body region 1206 of the vertical double-gate semiconductor device 1200. The layer 1206 may also be a part of the substrate 1202, wherein a portion of the substrate 1202 may e.g. be removed to form a substrate with a projection and then, the second source/drain region 1204 may be formed below the projection portion of the substrate 1202 e.g. by means of an inclined ion implantation process. The vertical semiconductor device 1200 may further include a body region, a portion of which may be a tunneling region 1208, in this case implemented as a halo region 1208, doped with n doping atoms, i.e. it may be n doped with n doping atoms (in case the source region of the vertical semiconductor device 1200 is highly p doped). In an implementation, the halo region 1208 may be n doped with a doping concentration in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$. Furthermore, a first source/drain region 1210 (e.g. a source region 1210) may be provided as a highly p doped ($p^+$ doped) region of a semiconductor material, e.g. a semiconductor compound material such as e.g. Size. The first source/drain region 1210 may be doped with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. The first source/drain region 1210 may have a thickness in the range from about 5 nm to about 100 nm, e.g. a thickness in the range from about 10 nm to about 25 nm, e.g. a thickness of about 15 nm to about 30 nm.

In another implementation the tunneling layer 1208 might include or consist of a thin insulator, e.g silicon dioxide, to avoid pinning of the Fermi level if the first source/drain region 1210 includes or consists of metal.

Furthermore, two gate dielectrics, a first dielectric 1212 and a second gate dielectric 1214 may be provided covering at least the respective exposed sidewall of the body region 1206, a respective exposed sidewall of the tunneling region 1208 and optionally a portion of a respective exposed sidewall of the first source/drain region 1210. The first dielectric 1212 and the second gate dielectric 1214 may be arranged at two opposite sides of the stack formed by the body region 1206, the tunneling region 1208, and the first source/drain region 1210. The gate dielectrics 1212, 1214 may have the same layer thickness and may be made of the same material as the gate dielectric layers described above. Two gate regions 1216 1218 may be provided on the gate dielectrics 1212, 1214 (wherein a first gate region 1216 may be provided on the first gate dielectric 1212 and a second gate region 1218 may be provided on the second gate dielectric 1214) such that a (tunnel) current flow from the first source/drain region 1210 via the tunneling region 1208, and the body region 1206 to the second source/drain region 1204 may be controlled via the application of appropriate voltages to the source/drain regions 1210, 1204 and the gate regions 1216, 1218. The gate regions 1216, 1218 may be made from the same materials as the gate regions described above in the other embodiments and may have similar layer thicknesses. The first source/drain region 1210 may be connected to a source terminal 1120 (e.g. via a source line), the second source/drain region 1204 may be connected to a drain terminal 1222 (e.g. via a drain line), and the gate regions 1216, 1218 may be connected to a respective gate terminal 1224, 1226 (e.g. via one or more gate lines).

In this double-gate vertical semiconductor device 1200 implementation, a small distance between the gate dielectrics 1212, 1214 and thus a small width (symbolized in FIG. 12 by means of a double arrow 1228) of the body region 1206 may improve the control of the gate regions 1216, 1218 on the inner part of the body region 1206 (i-Si). This may reduce leakage current and enhance the on-current ($I_{on}$).

Figure 13:
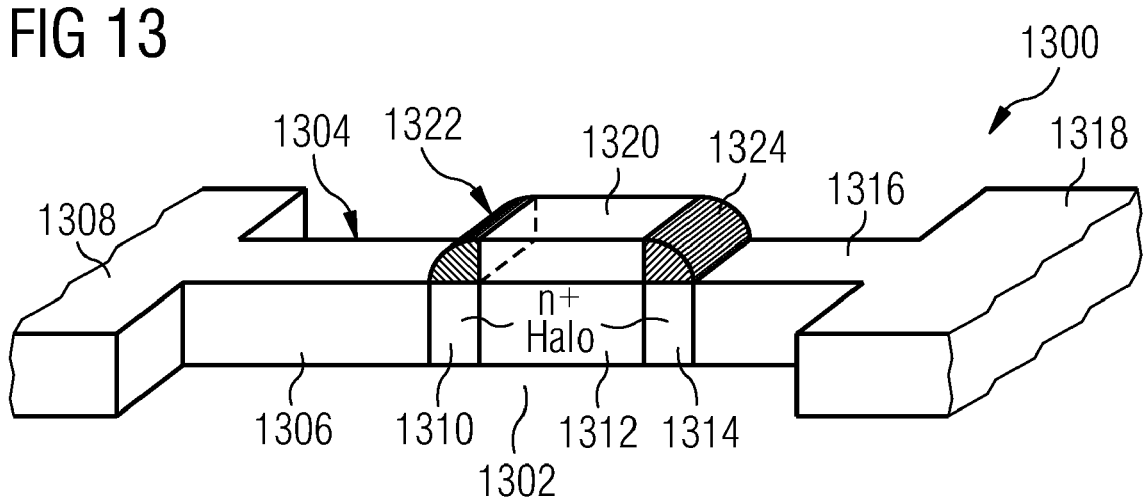
FIG. 13 shows yet another implementation of a semiconductor device in accordance with the embodiment of FIG. 10.

FIG. 13 shows yet another implementation of a semiconductor device 1300 in accordance with the embodiment of FIG. 10.

In this implementation, the semiconductor device 1300 is configured as a FINFET semiconductor device 1200, e.g. a Fin TFET device 1300. The semiconductor device 1300 may include a substrate 1302 (e.g. a p doped substrate 1302) such as e.g. a substrate 1302 as described with reference to the semiconductor device 100 of FIG. 1, or an SOI substrate 1302. A fin 1304 may be provided on the SOI substrate 1302, e.g. made of silicon. In this implementation, a first source/drain region 1306 (e.g. a source region 1306) may be provided as a highly p doped ($p^+$ doped) region of a semiconductor material, e.g. a semiconductor compound material such as e.g. SiGe. The first source/drain region 1306 may be doped with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. The first source/drain region 1306 may be provided in the fin 1304 or external of the fin 1304 (but in this case, connected to the fin 1304). Furthermore, in case the first source/drain region 1306 is provided in the fin 1304, it may be coupled to a source contact region 1308, which is located outside the fin 1304. In this implementation, adjacent to the first source/drain region 1306, a body region may be provided in the fin 1304, a portion of which may be a tunneling region 1310, in this case implemented as a halo region 1310, doped with n doping atoms, i.e. it may be n doped with n doping atoms (in case the source region 1306 of the vertical semiconductor device 1300 is highly p doped). In an implementation, the halo region 1310 may be n doped with a doping concentration in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$. Furthermore, a partially depleted or fully depleted body region 1312 of the fin semiconductor device 1300 may be provided in the fin 1304 adjacent to the tunneling region 1310 and opposite to the first source/drain region 1306. In an implementation, optionally, an additional halo region 1314 may be provided adjacent to the body region 1312 and opposite to the halo region 1310. The additional halo region 1314 n doped with a doping concentration in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$. Furthermore, in an implementation, second source/drain region 1316, e.g. a drain region 1316 (which may be provided in the fin 1304 or outside the fin 1304), which in this implementation may be highly n doped (n$^+$ doped) may be provided adjacent to the additional halo region 1314 and opposite to the body region 1312. The second source/drain region 1316 may be coupled to a drain contact region 1318, which may be provided outside the fin 1304. Furthermore, a gate dielectric (not shown in FIG. 13) may be wrapped around the fin 1304 covering a portion or the entire body region 1312 of the fin 1304, and optionally a portion of the tunneling region 1310. The gate dielectric may have the same layer thickness and may be made of the same material as the gate dielectric layers described above.

Moreover, a gate region 1320 may be provided on the gate dielectric also being wrapped around the fin 1304 covering the entire exposed body region 1312 of the fin 1304 such that a (tunnel) current flow from the first source/drain region 1306 via the tunneling region 1310, and the body region 1312 (and optionally via the additional halo region 1314) to the second source/drain region 1316 may be controlled via the application of appropriate voltages to the source/drain regions 1306, 1316 and the gate region 1320. The gate region 1320 may be made from the same materials as the gate regions described above in the other embodiments and may have similar layer thicknesses.

FIG. 14 shows a top view of a non-ambipolar n type TFET semiconductor device 1400 with halo doping in accordance with an embodiment.

As shown in FIG. 14, the TFET semiconductor device 1400 may include a highly p-type doped (e.g. having a doping concentration of about $10^{20}$ cm$^{-3}$) source region 1402 made of SiGe with 40% germanium content. Adjacent to the source region 1402, a highly n-type doped (e.g. having a doping concentration in the range from about $10^{19}$ cm$^{-3}$ to about $10^{20}$ cm$^{-3}$) halo region 1404 (as an example of a tunneling region) may be provided, e.g. as a portion of a body region. Furthermore, an intrinsically doped (e.g. having a doping concentration of about $10^{15}$ cm$^{-3}$) channel region 1406 (also referred to as body region 1406) may be provided adjacent to the halo region 1404 as a remaining portion of the body region, followed by an n-type doped (e.g. having a doping concentration of about $10^{17}$ cm$^{-3}$) drain region 1408. At both sides of at least the channel region 1406, the halo region 1404, and portions of the source region 1402 and the drain region 1408, gate dielectrics 1410, 1412 (e.g. made of hafnium oxide (HfO$_2$)) are provided, on which gate regions 1414, 1416 are provided, respectively.

FIG. 15 shows a top view of an ambipolar n type TFET semiconductor device 1500 with halo doping in accordance with an embodiment.

As shown in FIG. 15, the TFET semiconductor device 1500 may include a highly p-type doped (e.g. having a doping concentration of about $10^{20}$ cm$^{-3}$) source region 1502 made of SiGe with 40% germanium content. Adjacent to the source region 1502, a highly n-type doped (e.g. having a doping concentration in the range from about $10^{19}$ cm$^{-3}$ to about $10^{20}$ cm$^{-3}$) halo region 1504 (as an example of a tunneling region) may be provided. In this context, it is to be noted that e.g. the halo region 1504 may be provided as a portion of a body region and may be made of a material having a different energy band gap than the material of the channel region 1506 (as the remaining portion of the body region), which will be described in more detail below. Furthermore, the intrinsically doped (e.g. having a doping concentration of about $10^{15}$ cm$^{-3}$) channel region 1506 (also referred to as body region 1506) may be provided adjacent to the halo region 1504, followed by a p-type doped additional halo region 1508 (e.g. having a doping concentration of about $10^{20}$ cm$^{-3}$) and further followed by a highly n-type doped (e.g. having a doping concentration in the range from about $10^{19}$ cm$^{-3}$ to about $10^{20}$ cm$^{-3}$) drain region 1510. At both sides of at least the channel region 1506, the halo regions 1504, 1508, and portions of the source region 1502 and the drain region 1510, gate dielectrics 1512, 1514 (e.g. made of hafnium oxide (HfO$_2$)) are provided, on which gate regions 1516, 1518 are provided, respectively. In this implementation, two halo regions 1504, 1508 on both side of the channel region 1506 may be used with opposite type of doping of source region 1502 or drain region 1510.

In various embodiments, a semiconductor device is provided, which may include a substrate having a main processing surface, a first source/drain region comprising a first material of a first conductivity type, a second source/drain region comprising a second material of a second conductivity type, wherein the second conductivity type is different from the first conductivity type, wherein the second source/drain region may be laterally disposed from the first source/drain region, and a body region electrically coupled between the first source/drain region and the second source/drain region. The body region may extend deeper into the substrate than the first source/drain region in a first direction that is perpendicular to the main processing surface of the substrate. The semiconductor device may further include a gate dielectric disposed over the body region, a gate region disposed over the gate dielectric, and a portion of the body region may be a tunneling region comprising material having a different energy band gap than the first material of the first conductivity type. The gate region may extend next to at least a part of the tunneling region in the first direction (which may be perpendicular to the main processing surface of the substrate) or in a second direction from the first source/drain region to the second source/drain region.

In an implementation of this embodiment, the first material of the first conductivity type may include or consist of semiconductor material. Furthermore, the first material of the first conductivity type may include or consist of semiconductor compound material. By way of example, the first material of the first conductivity type may include one or more of the following materials:

IV-IV semiconductor compound material such as e.g. SiGe (e.g. for an n-channel TFET) or SiC (e.g. for a p-channel TFET);

III-V semiconductor compound material such as e.g. GaAs or InP;

II-VI semiconductor compound material such as e.g. AlGaAs;

a ternary semiconductor compound material; and a quaternary semiconductor compound material.

In another implementation of this embodiment, the first material of the first conductivity type may include or consist of metal, such as e.g. silicide.

In yet another implementation of this embodiment, the tunneling region may include or consist of different material than the first material of the first conductivity type. In yet another implementation of this embodiment, the tunneling region may include or consist of the same material as the first material of the first conductivity type, wherein the material of the tunneling region has a different concentration of doping atoms than the first material of the first conductivity type in the first source/drain region. In yet another implementation of this embodiment, the tunneling region may include or consist of the material including doping atoms of the second conductivity type. In yet another implementation of this embodiment, the tunneling region may include or consist of a halo doping region having doping atoms of the second conductivity type. In yet another implementation of this embodiment, the body region may include or consist of silicon. In yet another implementation of this embodiment, the body region may include or consist of silicon germanium. In yet another implementation of this embodiment, the semiconductor device may further include a first well region of the first conductivity type, wherein the first source/drain region is disposed in the first well region. In yet another implementation of this embodiment, the semiconductor device may further include a second well region of the second conductivity type, wherein the second source/drain region is disposed in the second well region. In yet another implementation of this embodiment, the semiconductor device may further include a third well region of the second conductivity type, wherein the first well region and the second well region are arranged in the third well region. In yet another implementation of this embodiment, the first material of the first conductivity type may include or consist of semiconductor material having a different energy band gap than the material of the body region. In yet another implementation of this embodiment the first material of the first conductivity type may include or consist of semiconductor material having a smaller energy band gap than the material of the body region. In yet another implementation of this embodiment, the first material of the first conductivity type may include or consist of semiconductor material having a larger energy band gap than the material of the body region. In yet another implementation of this embodiment, the material of the tunneling region may include or consist of semiconductor material having a different energy band gap than the material of the remaining portion of the body region. In yet another implementation of this embodiment, the material of the tunneling region may include or consist of semiconductor material having a smaller energy band gap than the material of the body region. In yet another implementation of this embodiment, the material of the tunneling region may include or consist of semiconductor material having a larger energy band gap than the material of the remaining portion of the body region.

In an embodiment, a semiconductor device is provided. The semiconductor device may include a substrate having a main processing surface, a first source/drain region comprising a first material of a first conductivity type, a second source/drain region comprising a second material of a second conductivity type, wherein the second conductivity type is different from the first conductivity type, and a body region electrically coupled between the first source/drain region and the second source/drain region, wherein the body region extends deeper into the substrate than the first source/drain region in a first direction that is parallel with the main processing surface of the substrate. The semiconductor device may further include a gate dielectric disposed over the body region, and a gate region disposed over the gate dielectric. The gate region may overlap with at least a part of the first source/drain region and with a part of the body region in the first direction.

Various embodiments provide a semiconductor device which may include a region of a wide-band material (like Si) which may be attached to a region of a narrow-band material (e.g. SiGe) and may be controlled by a FET gate; a highly doped region of a first conductivity type formed in the wide-band material which may extend underneath the gate and is different to the doping underneath the rest of the gate; and a highly doped region of a second conductivity type formed in the narrow-band material attached to the highly doped region of the wide-band material; and a gate region controlling the energy band edge in the wide-band material such that under the application of an appropriate voltage a larger tunneling current will be injected from the region of the narrow-band material (called source).

In various embodiments, a lateral device is provided, wherein the attached piece of the gate and the layer of the source are arranged next to each other and in parallel. Furthermore, the second contact region (e.g. drain region) may be next to the attached piece of the gate and in parallel. The current flow may be parallel to the (main processing) surface of the wafer.

FIG. 16 shows a semiconductor device 1600 in accordance with yet another embodiment.

The semiconductor device 1600 may include a first source/drain region 1602 being doped in accordance with a first conductivity type. Furthermore, the semiconductor device 1600 may further include a second source/drain region 1606 having a material doped in accordance with a second conductivity type, wherein the second conductivity type is different from the first conductivity type, and a body region 1604 electrically coupled between the first source/drain region 1602 and the second source/drain region 1606, wherein the body region 1604 may include a semiconductor compound material having a plurality of elements, wherein the body region 1604 may include a graded content profile of one element of the plurality of elements such that the content of the element in the material of the body region 1604 decreases with increasing distance from the first source/drain region 1602 in the direction of the second source/drain region 1606. Furthermore, the semiconductor device 1600 may further include a gate dielectric 1608 disposed over the body region, and a gate region 1610 disposed over the gate dielectric 1608.

In various embodiments, the semiconductor compound material may be SiGe, and the element with a graded profile in the body region may be Ge. The semiconductor device 1600 may be a planar device, a vertical device, a single-gate device, a double-gate device, or a fin FET device, for example.

Figure 17A:
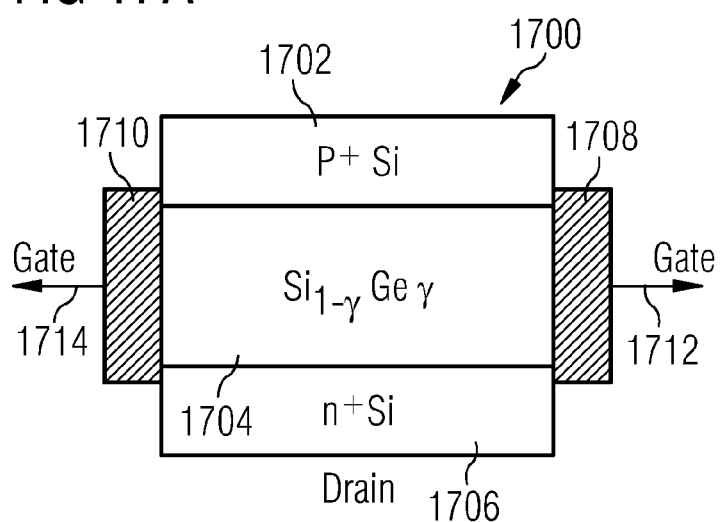
FIG. 17A shows an implementation of a semiconductor device in accordance with the embodiment shown in FIG. 16.
Figure 17B:
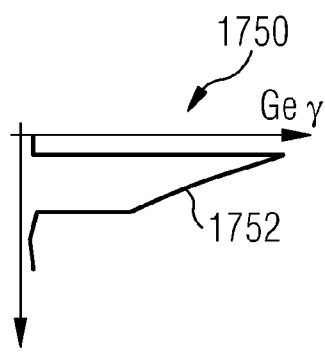
FIG. 17B shows a graded profile of the Ge content in the body region of the implementation of a semiconductor device shown in FIG. 17A.

FIG. 17A shows an implementation of a semiconductor device 1700 in accordance with the embodiment shown in FIG. 16. Furthermore, FIG. 17B shows a graded profile 1750 of the Ge content in the body region of the implementation of a semiconductor device 1700 shown in FIG. 17A. In this implementation, the semiconductor device 1700 is configured as a double-gate vertical semiconductor device 1700.

As shown in FIG. 17A, the semiconductor device 1700 may include a highly p doped ($p^+$ doped) source region 1702 as a first source/drain region.

In an implementation, the source region 1702 may contain or consist of silicon, e.g. being highly p doped ($p^+$ doped) with doping atoms (e.g. with boron (B)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$, e.g. with a doping concentration of doping atoms of about $10^{24}$ cm$^{-3}$.

Furthermore, a body region 1704 being disposed adjacent to the source region 1702 may contain or consist of silicon germanium with a varying composition, in particular with a varying content of germanium ($Si_{1-\gamma}Ge_\gamma$). In this implementation, a drain region 1706 may be provided adjacent to the body region 1704 opposite to the source region 1702. The drain region 1706 may include or consist of silicon, e.g. highly n doped (n$^+$ doped) silicon. The drain region 1706 may be doped with doping atoms (e.g. with phosphorous (P) or arsenic (As)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. As shown in characteristic 1752 in the diagram 1750 in FIG. 17B, the concentration γ of Ge in the $Si_{1-\gamma}Ge_\gamma$ in the body region decreases or declines towards the drain region 1706. In other words, the concentration γ of Ge in the $Si_{1-\gamma}Ge_\gamma$ is high at the source junction (by way of example, the concentration γ may be in the range from about 0.3 to about 1, e.g. in the range from about 0.3 to about 0.5 and low at the drain junction (by way of example, the concentration γ may be in the range from about 0 to about 0.3, e.g. about 0). The degraded profile 1752 of the concentration γ of Ge in the $Si_{1-\gamma}Ge_\gamma$ may be monotonically decreasing from the source region 1702 in the direction of the drain region 1706. The degraded profile 1752 of the concentration γ of Ge in the $Si_{1-\gamma}Ge_\gamma$ may have various portions having different gradients in the decrease of the concentration γ of Ge in the $Si_{1-\gamma}Ge_\gamma$.

Figure 18:
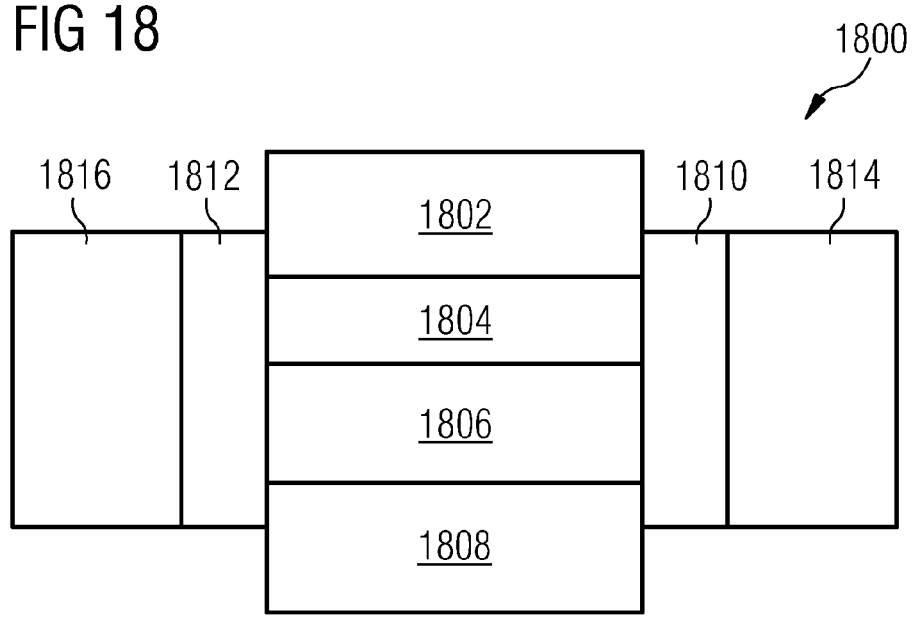
FIG. 18 shows a semiconductor device in accordance with yet another embodiment.

FIG. 18 shows a semiconductor device 1800 in accordance with yet another embodiment. In this embodiment, the semiconductor device 1800 is configured as a double-gate vertical TFET device.

In this implementation, a drain region 1808 may be provided. The drain region 1808 may include or consist of silicon, e.g. highly n doped (n$^+$ doped) silicon. The drain region 1808 may be doped with doping atoms (e.g. with phosphorous (P) or arsenic (As)) with a doping concentration of doping atoms in the range from about $10^{19}$ cm$^{-3}$ to about $10^{20}$ cm$^{-3}$, e.g. with a doping concentration of doping atoms in the range from about $5*10^{19}$ cm$^{-3}$ to about $5*10^{20}$ cm$^{-3}$, e.g. with a doping concentration of doping atoms of about $10^{24}$ cm$^{-3}$. Furthermore, a body region 1806 may be disposed over the drain region 1808, wherein the body region 1806 may contain or consist of silicon germanium. Furthermore, a halo region 1804 may be disposed over the body region 1806. In an implementation, the halo region 1804 may be highly n doped with a doping concentration in the range from about $10^{17}$ cm$^{-3}$ to about $10^{19}$ cm$^{-3}$, e.g. with a doping concentration in the range from about $5*10^{17}$ cm$^{-3}$ to about $5*10^{18}$ cm$^{-3}$, e.g. with a doping concentration of about $10^{18}$ cm$^{-3}$. In an implementation, the doping concentration of the halo region 1804 may be smaller than the doping concentration of the source region 1802, which will be described in more detail below. In an implementation, the semiconductor device 1800 may further include a highly p doped (p$^+$ doped) source region 1802 as a first source/drain region disposed over the halo region 1804. In an implementation, the source region 1802 may contain or consist of silicon, e.g. being highly p doped (p$^+$ doped) with doping atoms (e.g. with boron (B)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$.

Furthermore, two gate dielectrics 1810, 1812 may be disposed at two opposite sidewalls of exposed portions of at least the body region 1806 and the halo region 1804, and optionally also of some portions of the source region 1802 and the drain region 1808. The gate dielectrics 1810, 1812 may have the same layer thickness and may be made of the same material as the gate dielectric layers described above. Furthermore, two gate regions 1814, 1816 may be disposed on the two gate dielectrics 1810, 1812, respectively, such that a (tunnel) current flow from the source region 1802 via the halo region 1804, and the body region 1806 to the drain region 1808 may be controlled via the application of appropriate voltages to the source/drain regions 1802, 1808 and the gate regions 1814, 1816. The gate regions 1814, 1816 may be made from the same materials as the gate regions described above in the other embodiments and may have similar layer thicknesses.

Figure 19:
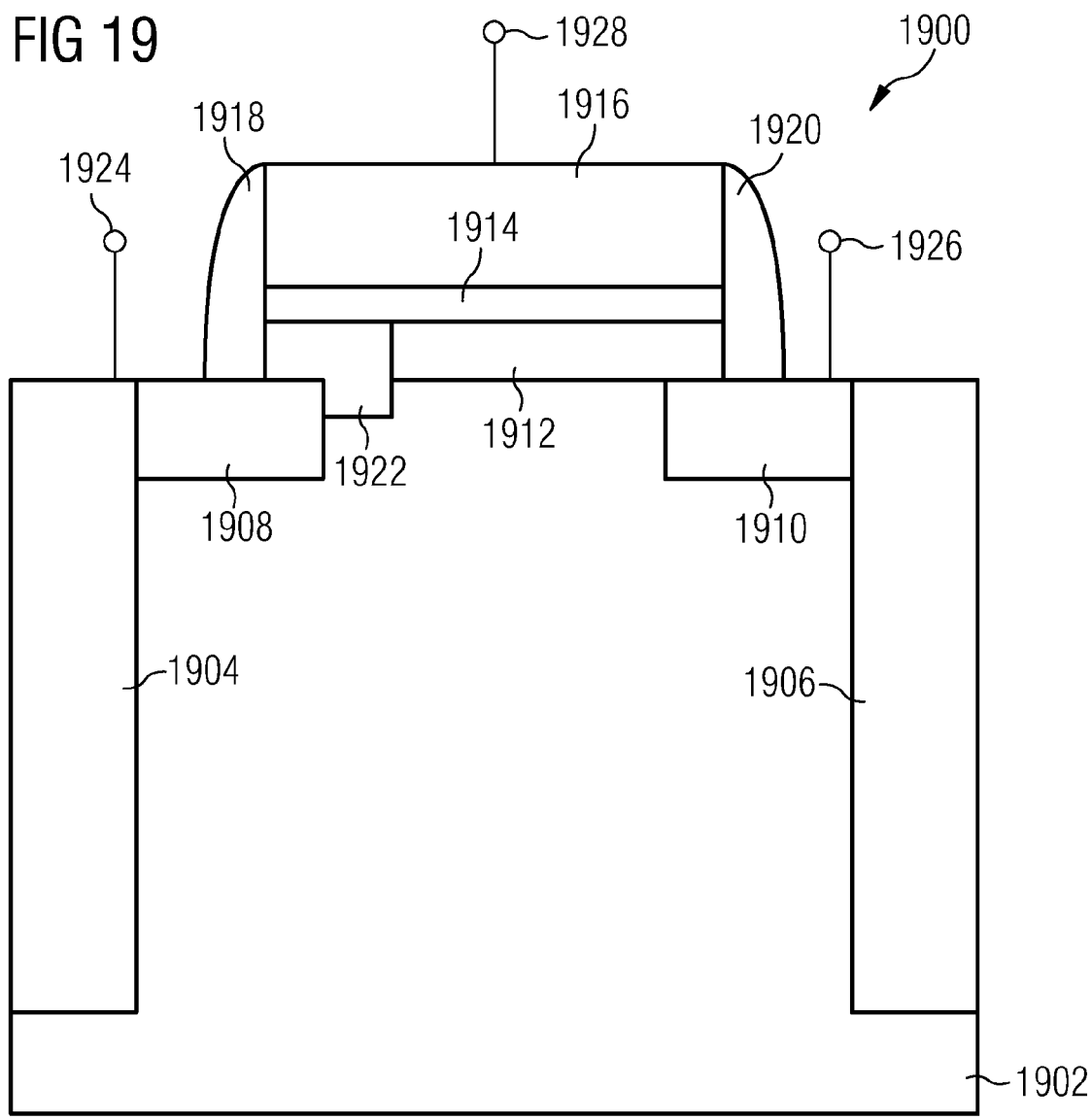
FIG. 19 shows a semiconductor device in accordance with yet another embodiment.

FIG. 19 shows a semiconductor device 1900 in accordance with yet another embodiment. The semiconductor device 1900 is configured as a lateral SiGe channel TFET containing an n halo region at the side of the source region.

In various embodiments, the semiconductor device 1900 may be formed in a substrate 1902 such as e.g. a substrate as described above.

The TFET semiconductor device 1900 may be laterally terminated by shallow trench isolations 1904, 1906 to electrically isolate the TFET semiconductor device 1900 from adjacent semiconductor devices provided in the substrate 1902.

The TFET semiconductor device 1900 may further include a first source/drain region 1908, e.g. a source region 1908, formed in or above the substrate 1902. In an implementation, the source region 1908 may contain or consist of silicon or SiGe, e.g. being highly p doped (p$^+$ doped) with doping atoms (e.g. with boron (B)) with a doping concentration of doping atoms in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$, e.g. with a doping concentration of doping atoms of about $10^{24}$ cm$^{-3}$. The source region 1908 may have a thickness in the range from about 5 nm to about 50 nm, e.g. a thickness in the range from about 7.5 nm to about 15 nm, e.g. a thickness of about 5 nm to about 10 nm.

In an implementation, the TFET semiconductor device 1900 may further include a second source/drain region 1910, e.g. a drain region 1910, formed in or above the substrate 1902. In an implementation, the drain region 1910 may contain or consist of SiGe, e.g. being highly n doped (n$^+$ doped) with doping atoms (e.g. with phosphorous (P) or arsenic (As)) with a doping concentration of doping atoms in the range from about $10^{19}$ cm$^{-3}$ to about $10^{21}$ cm$^{-3}$, e.g. with a doping concentration of doping atoms in the range from about $5\times10^{19}$ cm$^{-3}$ to about $5\times10^{20}$ cm$^{-3}$. The drain region 1910 may have a thickness in the range from about 5 nm to about 50 nm, e.g. a thickness in the range from about 7.5 nm to about 15 nm, e.g. a thickness of about 5 nm to about 10 nm.

In an implementation, a body region layer 1912 may be disposed over the upper surface of the substrate 1902 laterally disposed between the source region 1904 and the drain region 1910. The body region layer 1912 may include or consist of SiGe.

Furthermore, a gate dielectric layer 1914 may be disposed on the exposed upper surface of the body region layer 1912. The gate dielectric layer 1914 may include or consist of a dielectric material such as e.g. silicon oxide (SiO$_2$) or a high k dielectric material (i.e. e.g. a material having a dielectric constant of greater the than the dielectric constant of silicon oxide (which has a dielectric constant of 3.9)). In various implementations, the gate dielectric layer 818 may include or consist of aluminum oxide (Al$_2$O$_3$), yttrium oxide (Y$_2$O$_3$), hafnium oxide (HfO$_2$), lanthanum oxide (LaO$_2$), zirconium oxide (ZrO$_2$), amorphous silicon (a-Si), tantalum oxide (Ta$_2$O$_5$), titanium oxide (TiO$_2$), and/or an aluminate. An example for an aluminate is an alloy of the components aluminum, zirconium and oxygen (AlZrO). In an implementation, the gate dielectric layer 716 may include or consist of a dielectric layer stack including three dielectric layers being formed above one another, e.g. a first oxide layer (e.g. silicon oxide), a nitride layer as charge trapping layer (e.g. silicon nitride) on the first oxide layer, and a second oxide layer (e.g. silicon oxide or aluminum oxide) on the nitride layer. This type of dielectric layer stack is also referred to as ONO layer stack. In an alternative implementation, the gate dielectric layer 818 may include or consist of two, four or even more dielectric layers being formed above one another. In various implementations, the gate dielectric layer 818 may have a physical layer thickness in the range from about 1.5 nm to about 5 nm, e.g. a physical layer thickness in the range from about 2 nm to about 3 nm and/or an equivalent oxide thickness (EOT) in the range from about 1 nm to about 2 nm.

In an implementation, a gate region 1916 may be disposed over the gate dielectric layer 1914. The gate region 1916 may include or consist of electrically conductive material such as e.g. polysilicon (doped or undoped) or a metal such as a silicide (e.g. WSi). The width of the gate region 1916 may be in the range from about 20 nm to about 60 nm, e.g. in the range from about 30 nm to about 50 nm, e.g. about 40 nm.

In an implementation, electrically isolating sidewall spacers 1918, 1920 may be provided next to the exposed sidewalls of the gate region 1916, of the gate dielectric layer 1914 and the body region layer 1912. A first sidewall spacer 1918 may be disposed over a portion of the source region 1908, and a second sidewall spacer 1920 may be disposed over a portion of the drain region 1910. The sidewall spacers 1918, 1920 may include or consist of e.g. silicon oxide or silicon nitride. The width of the sidewall spacers 1918, 1920 may be in the range from about 20 nm to about 40 nm, e.g. in the range from about 25 nm to about 35 nm, e.g. about 30 nm.

Furthermore, in an implementation, a highly n doped halo region 1922 may be provided in a portion of the body region layer 1912 at the side junction of the source region 1908. The highly n doped halo region 1922 may extend into the substrate 1902 next to the source region 1908, the highly n doped halo region 1922 thereby forming an interface between the source region 1908 and the body region layer 1912, in which the electrically conductive channel may be formed. The highly n doped halo region 1922 may be highly p doped (in case the source region 1908 is p doped) having a doping concentration in the range from about $10^{17}$ cm$^{-3}$ to about $10^{19}$ cm$^{-3}$, e.g. in the range from about $5*10^{17}$ cm$^{-3}$ to about $5*10^{18}$ cm$^{-3}$.

The highly n doped halo region 1922 may extend into the substrate 1902 starting from the top surface of the source region 1908 or the drain region 1910 by a depth in the range from about 4 nm to about 30 nm, e.g. by a depth in the range from about 5 nm to about 20 nm.

The exposed upper surface of the source region 1908 may be contacted to a source terminal 1924 (e.g. via a source line), the exposed upper surface of the drain region 1910 may be contacted to a drain terminal 1926 (e.g. via a drain line), and the exposed upper surface of the gate region 1916 may be contacted to a gate terminal 1928 (e.g. via a gate line).

Figure 20:
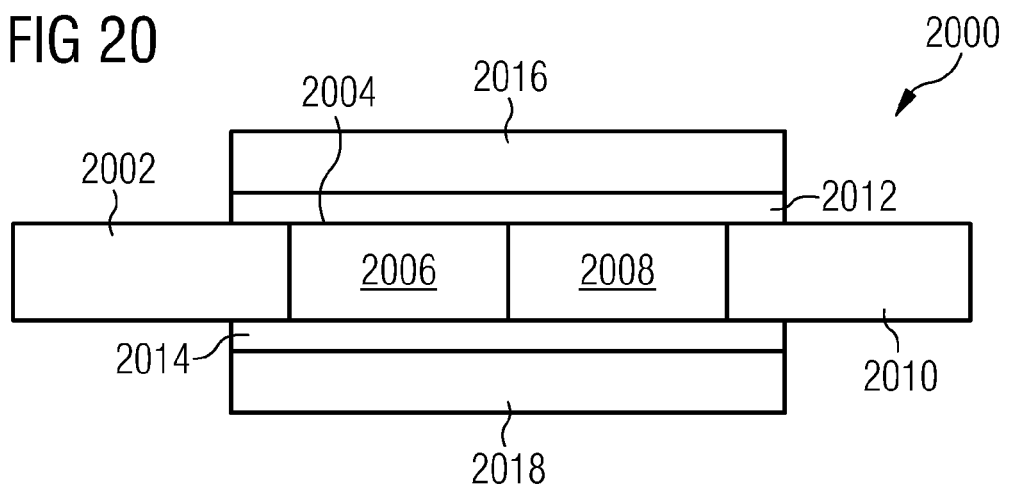
FIG. 20 shows a top view of a non-ambipolar p type TFET semiconductor device in accordance with an embodiment.
Figure 21:
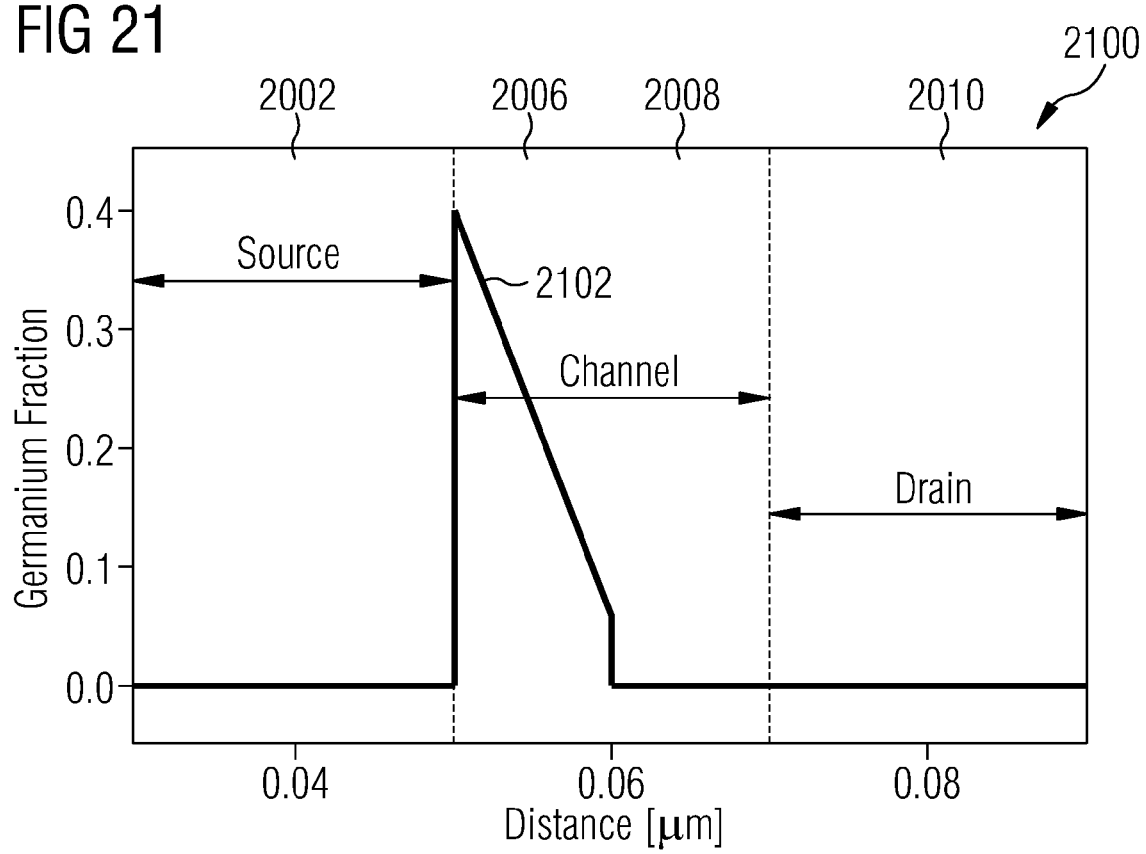
FIG. 21 shows a diagram illustrating the graded SiGe concentration profile in the channel region in accordance with an embodiment for the TFET semiconductor device of FIG. 20.

FIG. 20 shows a top view of a non-ambipolar p type TFET semiconductor device 2000 with a graded SiGe concentration profile in the channel region in accordance with an embodiment. FIG. 21 shows a diagram illustrating the graded SiGe concentration profile in the channel region in accordance with an embodiment for the non-ambipolar p type TFET semiconductor device 2000 of FIG. 20.

In various embodiments, as shown in FIG. 20, the non-ambipolar p type TFET semiconductor device 2000 may include a highly n type doped (e.g. having a doping concentration of about $10^{20}$ cm$^{-3}$) source region 2002, which may include or consist of silicon. Furthermore, a channel region 2004 may be provided next to the source region 2002. In an embodiment, the channel region 2004 may include two partial channel regions, namely a first partial channel region 2006 and a second partial channel region 2008. The first partial channel region 2006 (in FIG. 20 the left portion of the channel region 2004) is arranged proximate to the source region 2002, and the second partial channel region 2008 (in FIG. 20 the right portion of the channel region 2004) is arranged remote from the source region 2002. The channel region 2004 may be intrinsically doped, e.g. having a doping concentration of about $10^{15}$ cm$^{-3}$. In an embodiment, the first partial channel region 2006 may include or consist of graded, e.g. linearly graded SiGe and the second partial channel region 2008 may include or consist of silicon. The germanium content concentration variation over the non-ambipolar p type TFET semiconductor device 2000 is shown in a diagram 2100 in FIG. 21. As shown in a characteristic 2102 in the diagram 2100 in FIG. 21, the germanium content has its maximum (e.g. of 0.4) at the interface between the source region 2002 and the channel region 2004, in more detail, at the interface between the source region 2002 and the first partial channel region 2006. Then, in the first partial channel region 2006, with increasing distance from the source region 2002, the germanium content in the SiGe material of the first partial channel region 2006 linearly decreases down to "0" at the interface to the second partial channel region 2008 with an abrupt final decrease directly at the mentioned interface. Furthermore, a drain region 2010 may be provided proximate to the second partial channel region 2008 and remote from the first partial channel region 2006. The drain region 2010 may be a p-type doped (e.g. having a doping concentration of about $10^{17}$ cm$^{-3}$) drain region 2010. At both sides of at least the channel region 2004, and portions of the source region 2002 and the drain region 2010, gate dielectrics 2012, 2014 (e.g. made of hafnium oxide (HfO$_2$)) are provided, on which gate regions 2016, 2018 (e.g. made of metal) are provided, respectively. In the semiconductor device 2000, the silicon body thickness may be about 10 nm and a lateral overlap of the gate regions 2016, 2018 with the source region 2002 and the drain region 2010, respectively, may be about 2 nm.

Figure 22:
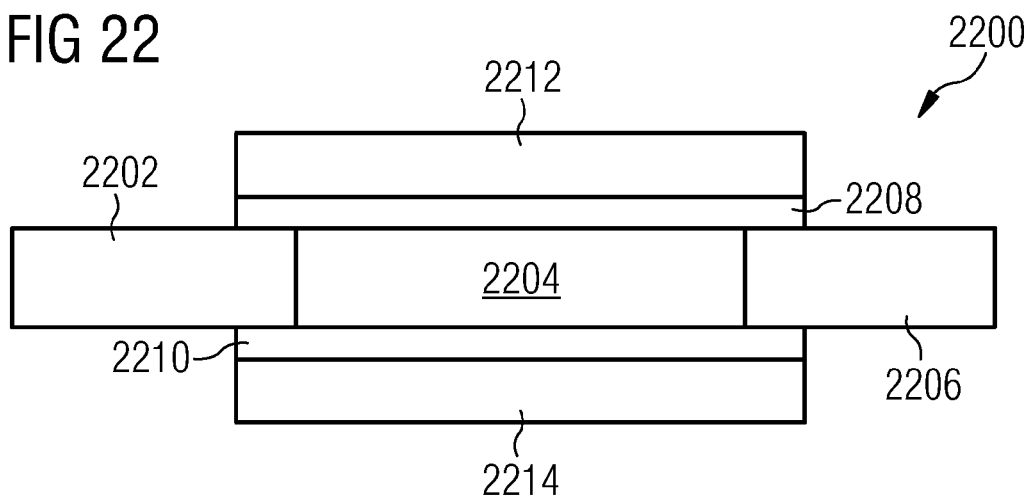
FIG. 22 shows a top view of a non-ambipolar n type TFET semiconductor device in accordance with an embodiment.
Figure 23:
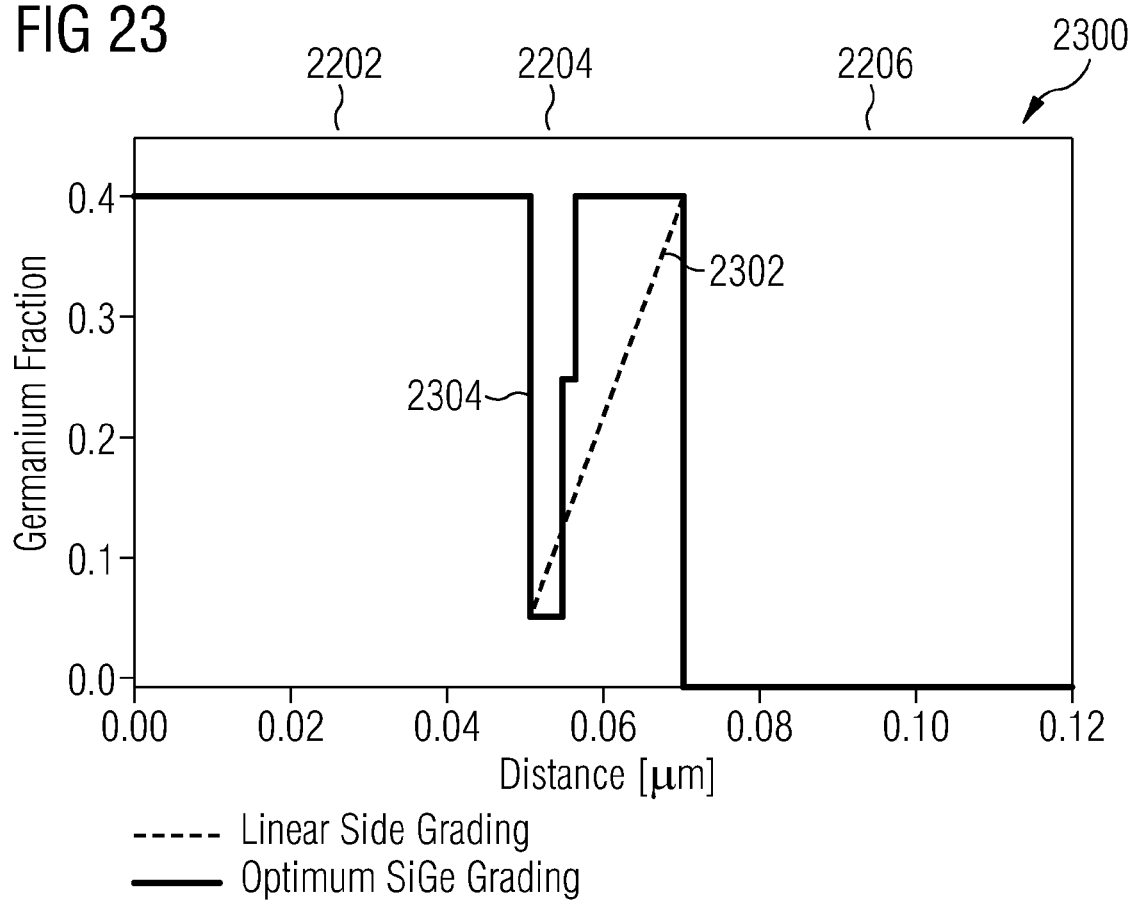
FIG. 23 shows a diagram illustrating the graded SiGe concentration profile in the channel region in accordance with an embodiment for the TFET semiconductor device of FIG. 22.

FIG. 22 shows a top view of a non-ambipolar n type TFET semiconductor device 2200 with a graded SiGe concentration profile in the channel region in accordance with an embodiment. FIG. 23 shows a diagram illustrating the graded SiGe concentration profile in the channel region in accordance with an embodiment for the n type TFET semiconductor device 2200 of FIG. 22.

In various embodiments, as shown in FIG. 22, the non-ambipolar n type TFET semiconductor device 2200 may include a highly p type doped (e.g. having a doping concentration of about $10^{20}$ cm$^{-3}$) source region 2202, which may include or consist of silicon germanium. Furthermore, a channel region 2204 may be provided next to the source region 2202. The channel region 2204 may be intrinsically doped, e.g. having a doping concentration of about $10^{15}$ cm$^{-3}$. In an embodiment, the channel region 2204 may include or consist of graded, e.g. linearly graded (as shown in a first characteristic 2302 in the diagram 2300 of FIG. 23) or optimally graded (as shown in a second characteristic 2304 in the diagram 2300 of FIG. 23) SiGe. The germanium content concentration variation over the non-ambipolar n type TFET semiconductor device 2200 is shown in the diagram 2300 in FIG. 23. As shown in the characteristics 2302, 2304 in the diagram 2300 in FIG. 23, the germanium content has its maximum (e.g. of 0.4) in the source region 2202, the abruptly falls down to its minimum (e.g. of 0.05) at the interface between the source region 2202 and the channel region 2204. Then, in the channel region 2204, with increasing distance from the source region 2202, the germanium content in the SiGe material of the channel region 2204 linearly (or in a step-wise abrupt manner) increases up to its maximum again (e.g. of 0.4) at the interface to the drain region 2206. Furthermore, a drain region 2206 may be provided proximate to the channel region 2204 and remote from the source region 2202. The drain region 2206 may be an n-type doped (e.g. having a doping concentration of about $10^{17}$ cm$^{-3}$) drain region 2206. At both sides of at least the channel region 2204, and portions of the source region 2202 and the drain region 2206, gate dielectrics 2208, 2210 (e.g. made of hafnium oxide (HfO$_2$)) are provided, on which gate regions 2212, 2214 (e.g. made of metal) are provided, respectively. In the semiconductor device 2200, the silicon body thickness may be about 10 nm and a lateral overlap of the gate regions 2212, 2214 with the source region 2202 and the drain region 2206, respectively, may be about 2 nm.

In various embodiments, it is provided to tailor the energy band structure in a way that the tunneling barrier may be significantly reduced without degrading the off-current ($I_{off}$) to a greater extent. In various embodiments, the energy band gap in the body region where the channel may be formed may be modified by introducing e.g. a layer of narrow band gap material like SiGe. This may lead to a step in the energy band edge which narrows the tunnel barrier. This again may significantly increase the on-current ($I_{on}$). On the same time due to the narrow bandgap in the SiGe layer an increase of the leakage current especially at elevated temperatures may be expected. Depending on the application this might be acceptable.

To minimize the influence on the off-current ($I_{off}$) and to optimize on-current ($I_{on}$) two measures may be applied in various embodiments:

1) the Ge content in the SiGe layer may be graded from high content at the source junction to lower content at the drain junction, as shown in FIGS. 17A and 17B in detail; and/or 2) an additional highly doped halo region in the SiGe layer may be introduced at the source junction with a dopant type opposite to the source doping, as shown in FIG. 18 in detail.

Both embodiments can be implemented e.g. in a vertically grown device as shown in FIG. 17A and FIG. 18.

In various embodiments, a semiconductor device may be provided, which may include:

a region of semiconductor compound material (such as e.g. SiGe) which is attached to a region of a material with a different band gap (e.g. Si) and is controlled by a FET gate region;

a composition of the semiconductor compound material which can vary over the region controlled by the gate to optimize the step of the energy band edge at the source region;

a gate region controlling the energy band edge in the semiconductor compound material such that under appropriate voltages a larger tunneling current will be injected from the region of the material with the different band gap (called source region);

additionally a highly doped region of first type formed in the semiconductor compound material which may extend underneath the gate region and may be different (in type and concentration) to the doping in the rest of the semiconductor compound material underneath the gate region and is of different type to the highly doped region of the material with different energy band gap attached to the region of semiconductor compound material.

In various embodiments, a lateral semiconductor device may be provided where the attached piece of the gate region and the layer of the source region are next to each other and in parallel. Also, the second contact region (drain region) may be next to the attached piece of the gate region and in parallel. The current may be parallel to the surface of the wafer substrate, for example.

Figure 24:
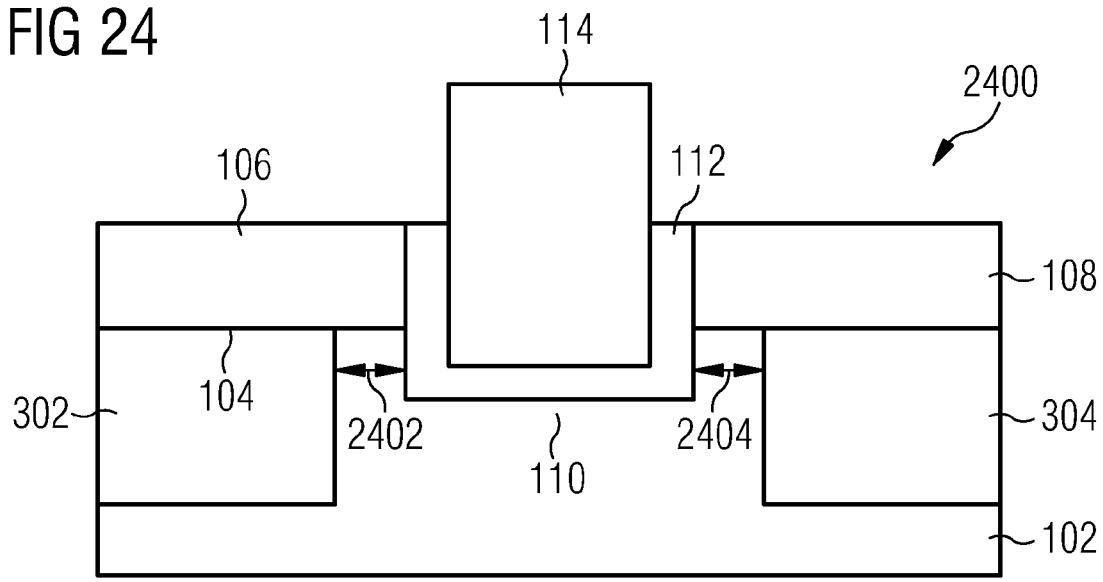
FIG. 24 shows a semiconductor device in accordance with yet another embodiment.

FIG. 24 shows a semiconductor device 2400 in accordance with yet another embodiment.

The semiconductor device 2400 of FIG. 24 is similar to the semiconductor device 300 shown in FIG. 3, however, with the difference that the well regions 302, 304 are not located immediately adjacent to the gate dielectric 112, but there is a first lateral distance (symbolized in FIG. 24 by means of a first double arrow 2402) between the first well region 302 and the left side of the gate dielectric 112, and a second lateral distance (symbolized in FIG. 24 by means of a second double arrow 2404) between the second well region 304 and the right side of the gate dielectric 112.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device, comprising:
a substrate having a main processing surface;
a first source/drain region comprising a first material of a first conductivity type;
a second source/drain region comprising a second material of a second conductivity type, wherein the second conductivity type is different from the first conductivity type, wherein the second source/drain region is laterally disposed from the first source/drain region;
a body region electrically coupled between the first source/drain region and the second source/drain region;
a gate dielectric disposed over the body region; and
a gate region disposed over the gate dielectric;
wherein the gate region overlaps with at least a part of the first source/drain region and with a part of the body region in a direction that is perpendicular to the main processing surface of the substrate;
wherein a portion of the body region is a tunneling region electrically coupled between the first source/drain region and a remaining portion of the body region, wherein the gate region overlaps with at least a part of the first source/drain region and with a part of the tunneling region in the direction that is perpendicular to the main processing surface of the substrate; and
wherein the tunneling region comprises different material than the first material of the first conductivity type.

2. The semiconductor device of claim 1, wherein the first material of the first conductivity type comprises semiconductor material.

3. The semiconductor device of claim 2, wherein the first material of the first conductivity type comprises semiconductor compound material.

4. The semiconductor device of claim 3, wherein the first material of the first conductivity type comprises semiconductor compound material under strain.

5. The semiconductor device of claim 1, wherein the first material of the first conductivity type comprises metal.

6. The semiconductor device of claim 1, wherein the first material of the first conductivity type comprises silicide.

7. The semiconductor device of claim 1, wherein the tunneling region comprises the material comprising doping atoms of the second conductivity type.

8. The semiconductor device of claim 1, wherein the tunneling region comprises a halo doping region.

9. The semiconductor device of claim 1, wherein the body region comprises silicon germanium.

10. The semiconductor device of claim 1, wherein the first material of the first conductivity type comprises semiconductor material having a different energy band gap than the material of the body region.

11. The semiconductor device of claim 1, wherein the material of the tunneling region comprises semiconductor material having a different energy band gap than the material of the remaining portion of the body region.

12. The semiconductor device of claim 1,
wherein the gate region extends next to at least a part of the tunneling region in a first direction that is perpendicular to the main processing surface of the substrate or in a second direction from the first source/drain region to the second source/drain region.

13. The semiconductor device of claim 1, wherein the tunneling region comprises material having a different energy band gap than the first material of the first conductivity type.

14. A semiconductor device, comprising:
a substrate having a main processing surface;
a first source/drain region comprising a first material of a first conductivity type;
a second source/drain region comprising a second material of a second conductivity type, wherein the second conductivity type is different from the first conductivity type, wherein the second source/drain region is laterally disposed from the first source/drain region;
a body region electrically coupled between the first source/drain region and the second source/drain region;
a gate dielectric disposed over the body region; and
a gate region disposed over the gate dielectric;
wherein the gate region overlaps with at least a part of the first source/drain region and with a part of the body region in a direction that is perpendicular to the main processing surface of the substrate;
wherein a portion of the body region is a tunneling region electrically coupled between the first source/drain region and a remaining portion of the body region, wherein the gate region overlaps with at least a part of the first source/drain region and with a part of the tunneling region in the direction that is perpendicular to the main processing surface of the substrate; and
wherein the tunneling region comprises the same material as the first material of the first conductivity type; wherein the material of the tunneling region has a different concentration of doping atoms than the first material of the first conductivity type in the first source/drain region.

15. The semiconductor device of claim 14, wherein the first material of the first conductivity type comprises semiconductor material.

16. The semiconductor device of claim 15, wherein the first material of the first conductivity type comprises semiconductor compound material.

17. The semiconductor device of claim 16, wherein the first material of the first conductivity type comprises semiconductor compound material under strain.

18. The semiconductor device of claim 14, wherein the first material of the first conductivity type comprises metal.

19. The semiconductor device of claim 14, wherein the first material of the first conductivity type comprises silicide.

20. The semiconductor device of claim 14, wherein the tunneling region comprises different material than the first material of the first conductivity type.

21. The semiconductor device of claim 14, wherein the tunneling region comprises the material comprising doping atoms of the second conductivity type.

22. The semiconductor device of claim 14, wherein the tunneling region comprises a halo doping region.

23. The semiconductor device of claim 14, wherein the body region comprises silicon germanium.

24. The semiconductor device of claim 14, wherein the first material of the first conductivity type comprises semiconductor material having a different energy band gap than the material of the body region.

25. The semiconductor device of claim 14, wherein the material of the tunneling region comprises semiconductor material having a different energy band gap than the material of the remaining portion of the body region.

26. The semiconductor device of claim 14,
wherein the gate region extends next to at least a part of the tunneling region in a first direction that is perpendicular to the main processing surface of the substrate or in a second direction from the first source/drain region to the second source/drain region.

27. The semiconductor device of claim 14, wherein the tunneling region comprises material having a different energy band gap than the first material of the first conductivity type.

* * * * *